(12) United States Patent
Hill

(10) Patent No.: US 7,193,726 B2
(45) Date of Patent: *Mar. 20, 2007

(54) OPTICAL INTERFEROMETRY

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 625 days.

This patent is subject to a terminal disclaimer.

(21) Appl. No.: 10/227,166

(22) Filed: Aug. 23, 2002

(65) Prior Publication Data

US 2003/0053079 A1 Mar. 20, 2003

Related U.S. Application Data

(60) Provisional application No. 60/314,569, filed on Aug. 23, 2001, provisional application No. 60/404,511, filed on Aug. 19, 2002, and provisional application No. 60/379,909, filed on May 13, 2002.

(51) Int. Cl.
*G01B 9/02* (2006.01)

(52) U.S. Cl. .................. 356/520; 356/500; 356/509
(58) Field of Classification Search ............... 356/520, 356/508–510, 500, 493, 482, 486, 498
See application file for complete search history.

(56) References Cited

U.S. PATENT DOCUMENTS

| | | | |
|---|---|---|---|
| 4,784,490 A | 11/1988 | Wayne | |
| 4,802,765 A | 2/1989 | Young et al. | |
| 4,881,815 A | 11/1989 | Sommargren | |
| 4,881,816 A | 11/1989 | Zanoni | |
| 4,883,357 A | 11/1989 | Zanoni et al. | |
| 5,064,289 A | 11/1991 | Bockman | |
| 5,200,797 A | 4/1993 | Tank et al. | |
| 5,471,304 A | 11/1995 | Wang | |
| 5,483,343 A | 1/1996 | Iwamoto et al. | |
| 5,675,412 A | 10/1997 | Solomon | |
| 5,715,057 A | 2/1998 | Bechstein et al. | 356/361 |

(Continued)

OTHER PUBLICATIONS

"Documentation Laser Interferometry in Length Measurement Techniques", Press of the Association of German Engineers, pp. 47–50 (Mar. 12 & 13, 1985), German document with English translation and with Affidavit of Accuracy.

"Documentation Precision of Laser Interferometer Systems", Press of the Association of German Engineers, pp. 97–98 (Apr. 1989), German document with English translation and with Affidavit of Accuracy.

*Primary Examiner*—Andrew H. Lee
(74) *Attorney, Agent, or Firm*—Fish & Richardson P.C.

(57) ABSTRACT

An interferometry system includes an interferometer to split an input beam into a measurement beam and at least one other beam. The interferometer directs the measurement beam along a measurement path that includes at least two passes to a measurement object, and overlaps the measurement beam with the other beam after the measurement beam completes the at least two passes. The path of the measurement beam is sheared during the first and second passes when the measurement object moves along a direction orthogonal to a portion of the measurement path that contacts the measurement object. The interferometry system includes optics to redirect the measurement beam after the first pass and before the second pass so that shear imparted during the second pass cancels shear imparted during the first pass. The optics also redirect the measurement beam after the second pass and before overlapping with the other beam so that the measurement beam propagates in a direction that is constant relative to the propagation direction of the other beam independent of changes in the orientation of the optics.

122 Claims, 16 Drawing Sheets

U.S. PATENT DOCUMENTS

| | | |
|---|---|---|
| 5,757,160 A | 5/1998 | Kreuzer |
| 5,757,491 A | 5/1998 | Cai et al. |
| 5,801,832 A | 9/1998 | Van Den Brink |
| 6,020,964 A | 2/2000 | Loopstra et al. |
| 6,046,792 A | 4/2000 | Van Der Werf et al. |
| 6,252,667 B1 | 6/2001 | Hill et al. |
| 6,271,923 B1 | 8/2001 | Hill |
| 6,313,918 B1 | 11/2001 | Hill |
| 6,552,804 B2 | 4/2003 | Hill |
| 6,762,845 B2 * | 7/2004 | Hill .......................... 356/520 |
| 2002/0001087 A1 | 1/2002 | Hill |

* cited by examiner

OPTICAL INTERFEROMETRY

CROSS-REFERENCE TO RELATED APPLICATIONS

This application claims priority under 35 Usc § 119(e) to Provisional Patent Application 60/314,569, filed on Aug, 23, 2001, entitled "ZERO SHEAR NON-PLANE MIRROR INTERFEROMETER," to Henry A. Hill, and to Provisional Patent Application 60/404,511, filed on Aug, 19, 2002, entitled "ZERO SHEAR NON-PLANE MIRROR INTERFEROMETER," also to Henry A. Hill, and to Provisional Patent Application 60/379,909, filed on May 13, 2002, entitled "ZERO SHEAR NON-PLANE MIRROR INTERFEROMETER", also to Henry A. Hill. The entire contents of the provisional patent applications are hereby incorporated by reference.

TECHNICAL FIELD

This invention relates to optical interferometry.

BACKGROUND

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

Referring to FIG. 1, a typical interferometry system 10 includes a source 20, an interferometer 30, a detector 40, and an analyzer 50. Source 20 includes a laser for providing an input beam 25 to interferometer 30. In one example where heterodyne interferometry technique is used, input beam 25 includes two different frequency components having orthogonal polarizations. An acousto-optical modulator may be used to introduce frequency splitting to produce the two frequency components. Alternatively, source 25 may include a Zeeman-split laser to produce the frequency splitting. Alternatively, the different frequencies can be produced internal to the laser using birefringent elements. In another example where homodyne interferometry technique is used, input beam 25 may have a single wavelength.

In a heterodyne interferometry system, the orthogonally polarized components are sent to interferometer module 30, where they are separated into measurement and reference beams using a polarizing beam splitter (PBS). The reference beam travels along a reference path. The measurement beam travels along a measurement path. The reference and measurement beams are later combined by the PBS to form an exit beam 35 with overlapping exit measurement and reference beams. In a homodyne interferometry system, a non-polarizing beam splitter may be used to separate the input beam into the measurement and reference beams.

Exit beam 35 subsequently passes through a polarizer (not shown). The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. The interference contains information about the relative difference in optical path length between the reference and measurement paths.

In one example, the reference path is fixed and the changes in the optical path length difference correspond to changes in the optical path length of the measurement path. In another example, the optical path length of both the reference and measurement paths may change, e.g., the reference path may contact a reference object that moves relative to interferometer module 30. In this case, changes in the optical path length difference correspond to changes in the position of the measurement object relative to the reference object.

Detector 40 includes a photodetector that measures the time-dependent intensity of the mixed beam and generates an electrical interference signal proportional to that intensity. Detector 40 may also include electronic components (e.g., an amplifier and an analog-to-digital converter) that amplifies the output from the photodetector and produces a digital signal corresponding to the optical interference.

When the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where $v$ is the relative speed of the measurement and reference objects, $\lambda$ is the wavelength of the measurement and reference beams, $n$ is the refractive index of the medium through which the light beams travel, e.g., air or vacuum, and $p$ is the number of passes to the reference and measurement objects. Changes in the relative position of the measurement object correspond to changes in the phase of the measured interference signal, with a $2\pi$ phase change substantially equal to a distance change L of $\lambda/(np)$, where L is a round-trip distance change, e.g., the change in distance to and from a stage that includes the measurement object.

Unfortunately, this equality is not always exact. In addition, the amplitude of the measured interference signal may be variable. A variable amplitude may subsequently reduce the accuracy of measured phase changes. Many interferometers include non-linearities such as what are known as "cyclic errors." The cyclic errors can be expressed as contributions to the phase and/or the intensity of the measured interference signal and have a sinusoidal dependence on the change in optical path length pnL. In particular, the first harmonic cyclic error in phase has a sinusoidal dependence on $(2\pi pnL)/\lambda$ and the second harmonic cyclic error in phase has a sinusoidal dependence on $2(2\pi pnL)/\lambda$. Higher harmonic cyclic errors can also be present.

There are also "non-cyclic non-lineaties" such as those caused by a change in lateral displacement (i.e., "beam shear") between the reference and measurement beam components of an output beam of an interferometer when the wavefronts of the reference and measurement beam components have wavefront errors. This can be explained as follows.

Inhomogeneities in the interferometer optics may cause wavefront errors in the reference and measurement beams. When the reference and measurement beams propagate collinearly with one another through such inhomogeneities, the resulting wavefront errors are identical and their contributions to the interferometric signal cancel each other out. More typically, however, the reference and measurement beam components of the output beam are laterally displaced from one another, i.e., they have a relative beam shear. Such beam shear causes the wavefront errors to contribute an error to the interferometric signal derived from the output beam.

Moreover, in many interferometry systems beam shear changes as the position or angular orientation of the measurement object changes. For example, a change in relative beam shear can be introduced by a change in the angular orientation of a plane mirror measurement object. Accordingly, a change in the angular orientation of the measurement object produces a corresponding error in the interferometric signal.

The effect of the beam shear and wavefront errors will depend upon procedures used to mix components of the output beam with respect to component polarization states and to detect the mixed output beam to generate an electrical interference signal. The mixed output beam may for example be detected by a detector without any focusing of the mixed beam onto the detector, by detecting the mixed output beam as a beam focused onto a detector, or by launching the mixed output beam into a single mode or multi-mode optical fiber and detecting a portion of the mixed output beam that is transmitted by the optical fiber. The effect of the beam shear and wavefront errors will also depend on properties of a beam stop should a beam stop be used in the procedure to detect the mixed output beam. Generally, the errors in the interferometric signal are compounded when an optical fiber is used to transmit the mixed output beam to the detector.

Amplitude variability of the measured interference signal can be the net result of a number of mechanisms. One mechanism is a relative beam shear of the reference and measurement components of the output beam that is for example a consequence of a change in orientation of the measurement object.

In dispersion measuring applications, optical path length measurements are made at multiple wavelengths, e.g., 532 nm and 1064 nm. The measurements are used to determine dispersion of the beams as they travel through a gas in the measurement path. The dispersion measurement can be used in converting the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged.

SUMMARY

In general, in one aspect, the invention is directed towards an interferometry system that includes an interferometer to split an input beam into a measurement beam and at least one other beam, to direct the measurement beam along a measurement path that includes at least two passes to a measurement object, to direct the other beam along a reference path that includes at least two passes to a reference object, and to overlap the measurement beam with the other beam after the measurement beam completes the at least two passes. The path of the measurement beam is sheared during the first and second passes when the measurement object moves. The interferometry system includes optics to redirect the measurement beam after the first pass and before the second pass so that shear imparted during the second pass cancels shear imparted during the first pass.

Implementations of the invention may include one or more of the following features. The shear of the measurement beam path is caused by a movement of the measurement object along a direction orthogonal to a portion of the measurement path that is incident on the measurement object during the first pass. The optics includes a first reflection surface to redirect the measurement beam after the first pass and before the second pass. The first reflection surface includes a plane reflection surface. The optics includes a second reflection surface to redirect the measurement beam after the second pass and before overlapping with the other beam. The first reflection surface remains parallel relative to the second reflection surface when the first and second reflection surfaces move. The optics include a mirror having a front reflection surface and a rear reflection surface, the front reflection surface to redirect the measurement beam after the first pass and before the second pass, the rear reflection surface to redirect the measurement beam after the second pass and before overlapping with the other beam. The front and rear reflection surfaces are parallel.

Implementations of the invention may include one or more of the following features. The first reflection surface, the second reflection surface, and the interferometer are arranged so that after the measurement beam and the other beam overlaps, the measurement beam propagates in a direction parallel to the propagation direction of the other beam independent of movements of the first and second reflection surfaces relative to the interferometer. The first reflection surface, the second reflection surface, and the interferometer are arranged so that after the measurement beam and the other beam overlaps, the relative beam shear between the measurement beam and the other beam remains constant independent of a movement of the measurement object. The measurement object includes a retroreflector or a constant deviation reflector. When the measurement object includes a retroreflector, a first portion of the measurement beam propagating toward the retroreflector during the first pass contacts the retroreflector at a first location, a second portion of the measurement beam propagating away from the retroreflector during the first pass contacts the measurement object at a second location, and the first and second locations are separated by a first distance. The measurement beam and the other beam overlaps to form an output beam that is separated from the input beam by a second distance. The second distance being smaller than the first distance.

Implementations of the invention may include one or more of the following features. The reference object includes a retroreflector or a plane reflection surface. When the reference object includes a retroreflector, the reference path is sheared during the first and second passes when the reference object moves. The shear in the reference path is caused by a movement of the reference object in a direction orthogonal to the direction of the path of a portion of the reference beam that in incident on the reference object during the first pass. The interferometry system includes second optics to redirect the other beam after the first pass and before the second pass so that shear imparted during the second pass cancels shear imparted during the first pass. The optics further redirects the measurement beam after the second pass and before overlapping with the other beam so that the measurement beam propagates in a direction that remains constant relative to a propagation direction of the other beam independent of a change in the orientation of the optics. The optics further redirects the measurement beam after the second pass and before overlapping with the other beam so that a relative beam shear between the measurement beam and the other beam remains constant independent of a movement of the measurement object. The optics comprise an odd number of reflection surfaces to receive a portion of the measurement beam traveling away from the retroreflector after the first pass and to redirect the portion of the measurement beam toward the retroreflector during the second pass such that the redirected portion and the portion of the measurement beam are substantially parallel. The measurement beam and the other beam have different frequencies.

Implementations of the invention may include one or more of the following features. The measurement object includes a constant deviation reflector. The optics include a truncated prism. The optics include a first reflection surface to redirect the measurement beam after the measurement beam travels the first pass but before the second pass. The optics include a second reflection surface to redirect the measurement beam after the measurement beam completes the first and second passes but before overlapping with the other beam. The constant deviation reflector reflects an input beam into an output beam such that the paths of the input and output beams form a first angle that remains constant independent of a propagation direction of the input beam. The first and second reflection surfaces form a second angle that is equal to the first angle. The constant deviation reflector and the optics are arranged so that after the measurement beam and the other beam overlaps, the measurement beam propagates in a direction parallel to the propagation direction of the other beam independent of a rotation of the optics relative to the interferometer. The constant deviation reflector and the optics are arranged so that after the measurement beam and the other beam overlaps, the relative beam shear between the measurement beam and the other beam remains constant independent of a movement of the constant deviation reflector. During the first pass, the measurement beam travels away from the interferometer and toward the measurement object, and is directed by the measurement object so that the measurement beam travels away from the measurement object and toward the optics. During the second pass, the measurement beam travels away from the optics and toward the measurement object, and is directed by the measurement object so that the measurement beam travels away from the measurement object and toward the interferometer.

Implementations of the invention may include one or more of the following features. The interferometry system includes a detector that responds to optical interference between the overlapping beams and produces an interference signal indicative of an optical path length difference between the paths of the beams. The detector includes a photodetector, an amplifier, and an analog-to-digital converter. The interferometry system includes an analyzer coupled to the detector to estimate a change in an optical path length difference of the beams based on the interference signal. The interferometry system includes a source to provide the beams.

In general, in another aspect, the invention is directed towards an interferometry system that includes an interferometer to split an input beam into a measurement beam and at least one other beam, to direct the measurement beam along a measurement path that includes at least two passes to a measurement object, and to overlap the measurement beam with the other beam after the measurement beam completes the at least two passes. The interferometry system includes optics to redirect the measurement beam after the first pass and before the second pass so that during the second pass, a portion of the measurement path traversed by the measurement beam propagating from the measurement object toward the interferometer remains the same independent of a movement of the measurement object. The optics also redirects the measurement beam after the second pass and before overlapping with the other beam.

Implementations of the invention may include one or more of the following features. The optics is designed so that during the second pass, the portion of the measurement path traversed by the measurement beam propagating from the measurement object toward the interferometer remains the same independent of a movement of the measurement object along a direction that is orthogonal to a portion of the measurement path that is incident on the measurement object during the first pass. The measurement object comprises a retroreflector. The optics comprise a first reflection surface and a second reflection surface, the first reflection surface to redirect the measurement beam after the first pass and before the second pass, the second reflection surface to redirect the measurement beam after the second pass and before overlapping with the other beam. The optics are arranged so that when the measurement beam overlaps with the other beam, the measurement beam propagates in a direction that remains constant relative to a propagation direction of the other beam independent of a change in the orientation of the optics. The optics include a mirror having a front reflection surface and a rear reflection surface. The front and rear reflection surfaces are parallel to each other. The measurement beam contacts each of the front and rear reflection surfaces of the mirror at least once during the first and second passes and before the measurement beam and the other beam are overlapped. The interferometer directs the other beam along a reference path. The measurement path and the reference path define an optical path length difference, and changes in the optical path length difference are indicative of changes in the relative positions of the measurement and reference objects. The measurement object includes a constant deviation reflector. The optics include two reflection surfaces oriented at an angle relative to one another.

In general, in another aspect, the invention is directed towards an interferometry system that includes an interferometer to split an input beam into a measurement beam and at least one other beam, to direct the measurement beam along a measurement path that includes at least two passes to a measurement object, and to overlap the measurement beam with the other beam after the measurement beam completes the at least two passes. The interferometry system includes a first optic to redirect the measurement beam after the first pass and before the second pass. The interferometry system includes a second optic to redirect the measurement beam after the second pass and before the measurement beam combines with the other beam. The first and second optics are oriented so that relative beam shear between the measurement beam and the other beam remains the same independent of a movement of the measurement object along a direction that is orthogonal to a portion of the measurement path that is incident on the measurement object during the first pass.

Implementations of the invention may include one or more of the following features. The first optics include a plane reflection surface or an odd number of plane reflection surfaces. The second optics include a plane reflection surface or an odd number of plane reflection surfaces. The first and second optics move in a fixed relationship relative to one another. The measurement beam and the other beam propagate in the same directions independent of movements of the first and second optics.

In general, in another aspect, the invention is directed towards an interferometry system that includes an interferometer to split an input beam into a measurement beam and at least one other beam, to direct the measurement beam along a measurement path that includes at least two passes to a cube corner retroreflector having reflection surfaces, and to overlap the measurement beam with the other beam after the measurement beam completes the at least two passes. The interferometry system includes an odd number of plane reflection surfaces to redirect the measurement beam traveling away from the retroreflector after the first pass and before the second pass so that during the second pass, the measurement beam travels toward a reflection surface of the retroreflector that was the last in sequence to be contacted by the measurement beam during the first pass. The interferometry system includes a reflection surface to redirect the measurement beam after the second pass and before overlapping with the other beam.

In general, in another aspect, the invention is directed towards an interferometry system that includes an interferometer to split an input beam into at least a first beam and a second beam, to direct the first beam along a first path that reflects from a first object, to direct the second beam along a second path that reflects from a second object, and to overlap the first and second beams after being reflected by the first and second objects, respectively. Portions of the second path traveling through a region in a direction non-parallel to the direction of the portion of the first beam contacting the first object. The interferometry system includes optics to direct portions of the first beam through the region such that a change in the environmental conditions of the region causes equal amounts of change in the optical path lengths of the first and second beams.

Implementations of the invention may include one or more of the following features. The region includes air or inert gas. The environmental conditions include temperature. The first object includes a retroreflector. The first path includes at least two passes to the first object. The optics include a first reflection surface that redirects the first beam after the first pass and before the second pass so that shear imparted to the first beam during the second pass cancels shear imparted to the first beam during the first pass, the shear being caused by a movement of the first object along a direction orthogonal to a portion of the first beam that is incident on the first object during the first pass. The optics include a second reflection surface that directs the first beam from a direction parallel to the direction of the portion of the first beam that is incident on the first object to a direction that is parallel to the portions of the second path passing through the region. The optics include a third reflection surface that redirects the first beam after the first beam completes the at least two passes and before overlapping with the second beam. The first reflection surface has an orientation that remains constant relative to an orientation of the third reflection surface. The first and third reflection surfaces are oriented so that when the first beam overlaps with the second beam, the first beam propagates in a direction that is constant relative to a propagation direction of the second beam independent of a change in the orientation of the first reflection and third reflection surfaces.

In general, in another aspect, the invention is directed towards an interferometry system that includes an interferometer to split an input beam into at least a first beam and a second beam, to direct the first beam along a first path that reflects from a first object, to direct the second beam along a second path that reflects from a second object, and to overlap the first and second beams after being reflected by the first and second objects, respectively. The first path includes two passes to the first object, the first path during the first pass includes two portions that contact the first object, the two portions lie along a first plane. The second path includes two passes to the second object, the second path during the first pass includes two portions that contact the second object, the two portions lie along a second plane. The first path is sheared during the first and second passes when the first object moves along a direction orthogonal to one of the two portions of the first path that contacts the first object. The interferometry system includes optics to redirect the first beam after the first pass and before the second pass so that shear imparted during the second pass cancels shear imparted during the first pass.

Implementations of the invention may include one or more of the following features. The first plane is parallel to the second plane and spaced apart from the second plane. The second path is sheared during the first and second passes when the second object moves along a direction orthogonal to a portion of the second path that contacts the second object. The interferometer includes a beam splitter to split the input beam. The first object includes retroreflector. A usable clear aperture of the retroreflector is larger than a clear aperture of the beam splitter.

In general, in another aspect, the invention is directed towards a lithography system for use in fabricating integrated circuits on a wafer. The lithography system includes a stage to support the wafer, an illumination system to image spatially patterned radiation onto the wafer, a positioning system to adjust the position of the stage relative to the imaged radiation, and at least one of the interferometry systems described above. The interferometry system is used to measure the position of the stage.

Implementations of the invention may include one or more of the following features. The interferometry system measures the position of the stage along a first degree of freedom. The lithography system further includes a second interferometry system to measure the position of the stage along a second degree of freedom.

In general, in another aspect, the invention is directed towards a lithography system for use in fabricating integrated circuits on a wafer. The lithography system includes a stage to support the wafer, an illumination system including a radiation source, a mask, a positioning system, a lens assembly, and at least one of the interferometry systems described above. During operation, the source directs radiation through the mask to produce spatially patterned radiation, the positioning system adjusts the position of the mask relative to the wafer, the lens assembly images the spatially patterned radiation onto the wafer, and the interferometry system measures the position of the mask relative to the wafer.

Implementations of the invention may include one or more of the following features. The interferometry system measures the position of the mask along a first degree of freedom. The lithography system further includes a second interferometry system to measure the position of the mask along a second degree of freedom.

In general, in another aspect, the invention is directed towards a beam writing system for use in fabricating a lithography mask. The beam writing system includes a source to provide a write beam to pattern a substrate, a stage to support the substrate, a beam directing assembly to deliver the write beam to the substrate, a positioning system to position the stage and beam directing assembly relative one another, and at least one of the interferometry systems described above. The interferometry system is used to measure the position of the stage relative to the beam directing assembly.

In general, in another aspect, the invention is directed towards an interferometry method that includes directing a measurement beam along a measurement path through an interferometer, the measurement path including at least two passes to a measurement object. The path of the measurement beam is sheared during the first and second passes when the measurement object moves. The method further includes directing at least one other beam through the interferometer, redirecting the measurement beam after the first pass and before the second pass so that shear imparted during the second pass cancels shear imparted during the first pass, and overlapping the measurement beam with the other beam after the measurement beam completes the at least two passes.

Implementations of the invention may include one or more of the following features. The path of the measurement beam is sheared during the first and second passes when the measurement object moves along a direction orthogonal to a portion of the measurement path that is incident on the measurement object during the first pass. The interferometry method further includes redirecting the measurement beam after the measurement beam completes the at least two passes and before overlapping with the other beam so that when the measurement beam overlaps with the other beam, the measurement beam propagates in a direction that remains constant relative to the propagation direction of the other beam. The interferometry method further includes separating an input beam into the measurement beam and the at least one other beam. The interferometry method further includes directing the other beam along a reference path that includes at least two passes to a reference object. The reference object includes a retroreflector or a plane reflection surface. The measurement object includes a retroreflector or a constant deviation reflector. The interferometry method further includes determining an optical path length difference between the measurement and reference paths. The interferometry method further includes determining changes in the position of the measurement object relative to the reference object based on changes in the optical path length difference. The measurement beam and the other beam have different frequencies. The interferometry method includes detecting an interference signal from the overlapping beams. The interferometry method includes determining changes in the position of the measurement object based on the interference signal.

In general, in another aspect, the invention is directed towards an interferometry method that includes directing a measurement beam along a measurement path through an interferometer, the measurement path including at least two passes to a measurement object. The method further includes directing at least one other beam through the interferometer, and redirecting the measurement beam after the first pass and before the second pass so that during the second pass, a portion of the measurement path traversed by the measurement beam propagating from the measurement object toward the interferometer remains the same independent of a movement of the measurement object. The method further includes overlapping the measurement beam and the other beam after the measurement beam completes the at least two passes.

Implementations of the invention may include one or more of the following features. The measurement beam is redirected so that during the second pass, the portion of the measurement path traversed by the measurement beam propagating from the measurement object toward the interferometer remains the same independent of a lateral movement of the measurement object along a direction that is orthogonal to a portion of the measurement path that is incident on the measurement object. The interferometry method further includes redirecting the measurement beam after the measurement beam completes the at least two passes and before overlapping with the other beam so that when the measurement beam overlaps with the other beam, the measurement beam propagates in a direction that remains constant relative to a propagation direction of the other beam. The measurement object includes a retroreflector or a constant deviation reflector.

In general, in another aspect, the invention is directed towards an interferometry method that includes separating an input beam into a measurement beam and at least one other beam, directing the measurement beam along a measurement path that includes at least two passes to a cube corner retroreflector having reflection surfaces. The interferometry method further includes redirecting the measurement beam traveling away from the retroreflector after the first pass and before the second pass so that during the second pass, the measurement beam travels toward a reflection surface of the retroreflector that was the last in sequence to be contacted by the measurement beam during the first pass. The interferometry method further includes overlapping the measurement beam with the other beam after the measurement beam completes the at least two passes.

In general, in another aspect, the invention is directed towards an interferometry method that includes directing a measurement beam along a measurement path through an interferometer, the measurement path including at least two passes to a measurement object. The interferometry method further includes directing at least one other beam through the interferometer, redirecting the measurement beam after the first pass and before the second pass so that relative beam shear between the measurement path and the other path remains the same independent of a lateral movement of the measurement object along a direction that is orthogonal to a portion of the measurement path that is incident on the measurement object, and overlapping the measurement beam and the other beam after the measurement beam completes the at least two passes.

Implementations of the invention may include one or more of the following features. Redirecting the measurement beam after the first pass and before the second pass causes the relative beam shear between the measurement path and the other path to remain the same independent of a movement of the measurement object along a direction that is orthogonal to a portion of the measurement path that is incident on the measurement object. The interferometry method includes redirecting the measurement beam after the measurement beam completes the at least two passes and before overlapping with the other beam so that when the measurement beam overlaps with the other beam, the measurement beam propagates in a direction that remains constant relative to a propagation direction of the other beam. The measurement object includes a retroreflector.

In general, in another aspect, the invention is directed towards an interferometry method that includes directing a first beam along a first path through an interferometer, the first path contacting a first object, directing a second beam along a second path through the interferometer, the second path contacting a second object, portions of the second path traveling through a region in a direction non-parallel to the direction of the portion of the first beam contacting the first object. The interferometry method further includes directing portions of the first beam through the region such that a change in the environmental conditions of the region causes equal amounts of change in the optical path lengths of the first and second beams, and overlapping the first and second beams after being reflected by the first and second objects, respectively.

Implementations of the invention may include one or more of the following features. The environmental conditions include temperature. The first path includes at least two passes to the first object. The interferometry method includes redirecting the first beam after the first pass and before the second pass so that shear imparted to the measurement beam during the first pass is canceled by shear imparted to the measurement beam during the second pass, the shear being caused by a shift in the position of the first object in a direction orthogonal to the direction of a portion of the first beam contacting the first object. The interferometry method includes directing the first beam from a direction parallel to the direction of the portion of the first beam contacting the first object to a direction that is parallel to the portions of the second path passing through the region.

Implementations of the invention may further include one or more of the following features. The interferometry method further includes redirecting the first beam after the first beam completes the at least two passes and before overlapping with the second beam so that when the first beam overlaps with the second beam, the first beam propagates in a direction that is constant relative to a propagation direction of the second beam. The interferometry method further includes redirecting the first beam after the first pass and before the second pass so that when the first and second beams overlap, a relative shear between the first and second beams remains constant independent of a movement of the first object in a direction orthogonal to the direction of a portion of the first beam that is incident on the first object.

In general, in another aspect, the invention is directed towards a lithography method that includes supporting a wafer on a stage, imaging spatially patterned radiation onto the wafer, adjusting the position of the stage relative to the imaged radiation, and using at least one of the interferometry methods described above to measure the relative position of the stage.

Implementations of the invention may include one or more of the following features. One interferometry method may be used to measure the relative position of the stage along a first degree of freedom. Another interferometry method may be used to measure the relative position of the stage along a second degree of freedom.

In general, in another aspect, the invention is directed towards a lithography method that includes supporting a wafer on a stage, directing radiation from a source through a mask to produce spatially patterned radiation, positioning the mask relative to the wafer, using at least one of the interferometry methods described above to measure the position of the mask relative to the wafer, and imaging the spatially patterned radiation onto the wafer.

In general, in another aspect, the invention is directed towards a beam writing method that includes providing a write beam to pattern a substrate, supporting the substrate on a stage, delivering the write beam to the substrate, positioning the stage relative to the write beam, and using at least one of the interferometry methods described above to measure the relative position of the stage.

Other features, objects, and advantages of the invention will be apparent from the following detailed description.

DESCRIPTION OF DRAWINGS

Like reference symbols in the various drawings indicate like elements.

DETAILED DESCRIPTION

Figure 1:
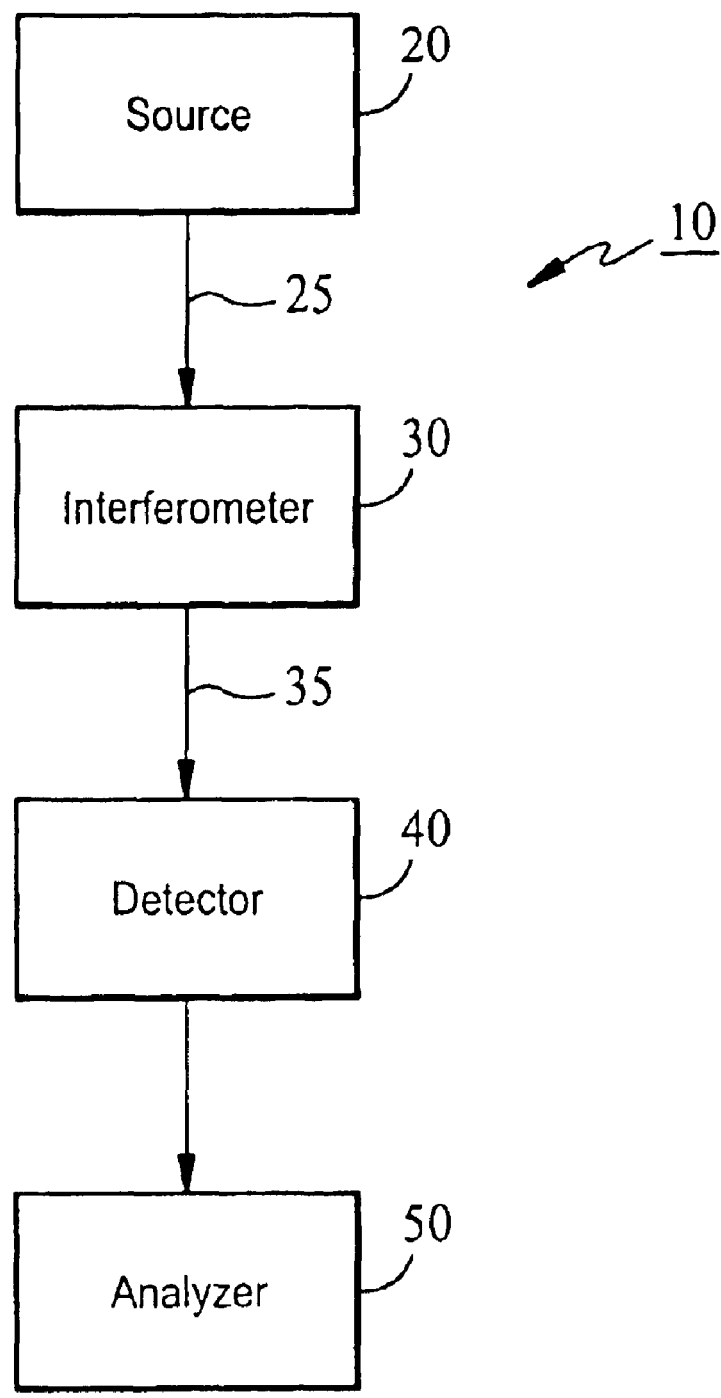
FIG. 1 is a diagram of an interferometry system.
Figure 2:
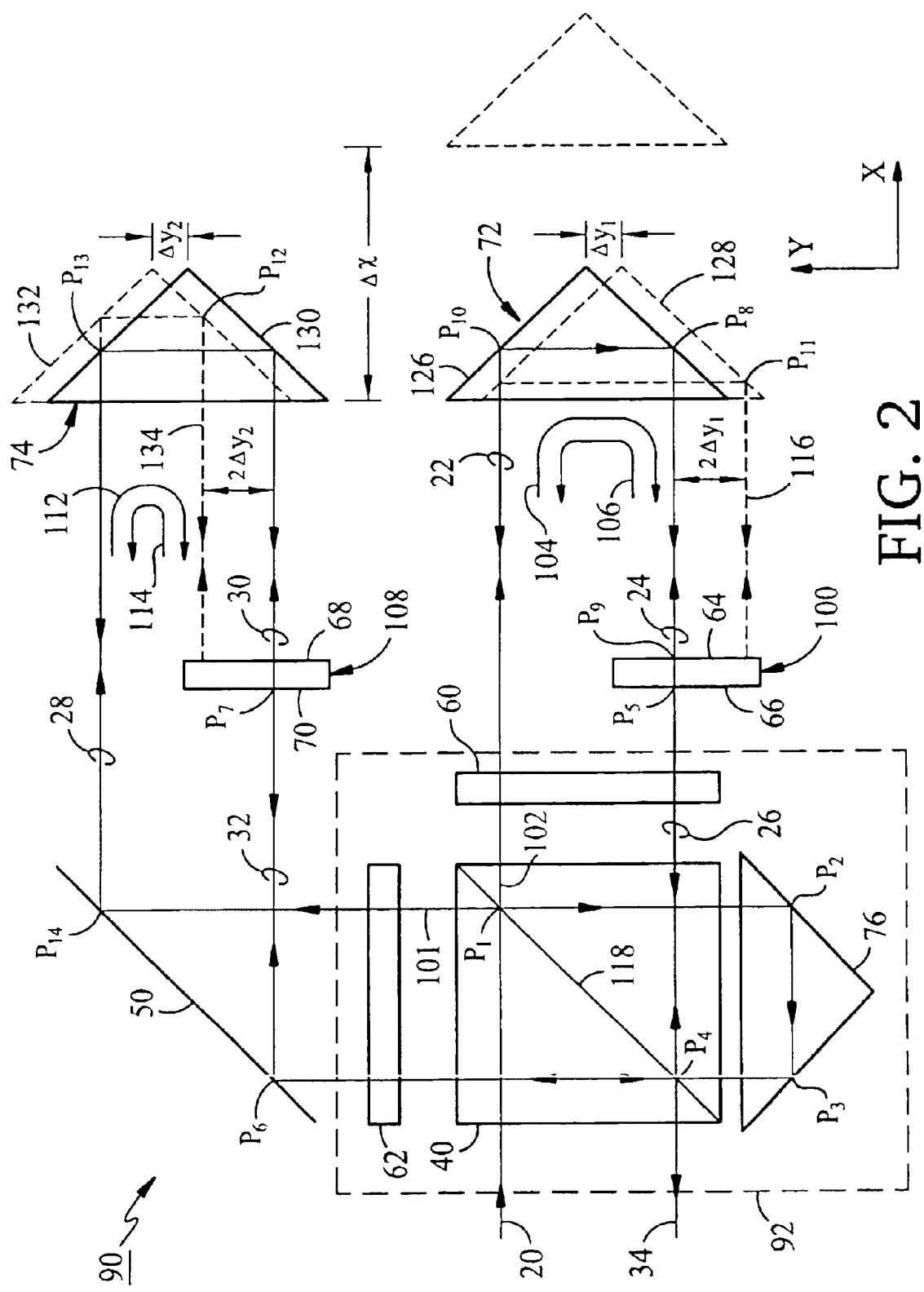
FIGS. 2–9 show interferometry systems.

Referring to FIG. 2, a plane mirror 100 is used in an interferometry system 90 to reflect a measurement beam 102 after a first pass 104 through a measurement retroreflector 72 and before a second pass 106 so that during the second pass, the path of the measurement beam retraces the path it traversed during the first pass. By causing the paths during the first and second passes to overlap, shear $2\Delta y_1$ imparted to the measurement beam during the first pass due to a lateral shift $\Delta y_1$ of retroreflector 72 is automatically canceled during the second pass. A similar cancellation is also achieved by a mirror 108 with respect to a reference beam 101. This ensures an accurate measurement of changes $\Delta x$ in the relative positions of retroreflector 72 and a reference retroreflector 74 despite lateral motions of either or both retroreflectors.

Interferometry system 90 includes a double-pass interferometer 92, the retroreflectors 72 and 74, the mirrors 100 and 108, a polarizing beam splitter (PBS) 40, quarter-wave phase retardation plates 60 and 62, and a retroreflector 76. PBS 40 includes a beam splitting surface 118 that separates orthogonal components of input beam 20 at point $P_1$ into the reference beam 101 and the measurement beam 102. Measurement beam 102 makes a double pass (passes 104 and 106) through retroreflector 72. After the first pass 104 and before the second pass 106, the measurement beam is reflected by a reflecting surface 64 of mirror 100 such that during the second pass 106, the measurement beam retraces the path it traversed during the first pass 104 and propagates toward point $P_1$. The paths of the measurement beam during the first and second passes overlap.

Retroreflectors 72, 74, and 76 may, for example, each include a cube corner reflector with three internal reflection surfaces such that a beam traveling toward the cube corner reflector will be reflected in a direction opposite but parallel to the incident direction of the beam.

In FIG. 2 (as well as FIGS. 4, 4A, 4B, 5, 9, 14, and 16), the light source, the detector, and the analyzer are not shown.

For ease of illustration, different reference numerals will be used to refer to the same measurement beam (or same reference beam) at different locations. For example, reference numeral 24 will be used to represent the portion of the measurement beam between a point $P_8$ on retroreflector 72 and a point $P_9$ on reflection surface 64. The portion of the measurement beam 24 has two components: a first component is the portion of the measurement beam that travels from point $P_8$ to point $P_9$ during the first pass, a second component is the portion of the measurement beam that travels from point $P_9$ to point $P_8$ during the second pass.

Reference numeral 22 will be used to represent the portion of the measurement beam between a point $P_{10}$ on retroreflector 72 and point $P_1$. The portion of measurement beam 22 has two components: a first component is the portion of the measurement beam that travels from point $P_1$ to point $P_{10}$ during the first pass, and a second component is the portion of the measurement beam that travels from point $P_{10}$ to point $P_1$ during the second pass.

Interferometry system 90 is designed to measure changes in the relative positions of retroreflectors 72 and 74 along the X-direction. If (e.g., due to misalignment of retroreflector 72) the retroreflector shifts $\Delta y_1$ laterally from an aligned position 126 to a misaligned position 128, a beam shear of $2\Delta y_1$ will be induced in beam 116 (shown in dashed lines) after reflection by retroreflector 72 at point $P_{11}$ during the first pass 104. The beam shear represents the shift between the path of beam 116 and the intended beam path 24 if retroreflector 72 were at the aligned position 126.

This $2\Delta y_1$ beam shear is compensated by sending the sheared beam back through retroreflector 72 a second time (second pass 106). This is achieved by using the reflection surface 64 of mirror 100 to reflect the measurement beam 116 back towards its incoming path. The $2\Delta y_1$ beam shear is canceled because the path of the measurement beam during the second pass coincides with the path of the measurement beam during the first pass. The two components of measurement beam 116 (one traveling toward surface 64 and the other traveling away from surface 64) will be coextensive (overlap and without beam shear) independent of lateral shear in retroreflector 72. Likewise, the first and second components of beam 22 will also be coextensive independent of lateral shear in retroreflector 72.

Reference beam 101 is reflected by a fold mirror 50 at point $P_{14}$ and makes a double pass through retroreflector 74. After a first pass 112 and before a second pass 114, the reference beam is reflected by a front reflecting surface 68 of mirror 108 such that during the second pass, the measurement beam retraces the path it traversed during the first pass and propagates toward point $P_1$ (i.e., the paths of the reference beam during the first and second passes overlap).

If (e.g., due to misalignment of retroreflector 74) the retroreflector shifts $\Delta y_2$ laterally from an aligned position 130 to a misaligned position 132, a beam shear of $2\Delta y_2$ will be induced in beam 134 (shown in dashed lines) after reflection by a point $P_{12}$ on retroreflector 74 during the first pass 112. This $2\Delta y_2$ beam shear is compensated by sending the sheared beam back through retroreflector 74 a second time (second pass 114). This is achieved by using reflection surface 68 to reflect beam 134 back toward its incoming path.

The $2\Delta y_2$ beam shear is canceled because the path of the reference beam during the second pass coincides with the path of the reference beam during the first pass. The first and second components of measurement beam 134 (one traveling toward surface 68 and the other traveling away from surface 68) will be coextensive independent of lateral shear in retroreflector 74. Likewise, the first and second components of beam 28 will also be coextensive (i.e., no beam shear) independent of lateral shear in retroreflector 74.

The measurement beam 102 makes four passes through quarter-wave phase retardation plate 60. Plate 60 is oriented so that the plane of polarization of the measurement beam is rotated by 90 degrees after a double pass through the plate.

The first component of beam 22 (propagating from $P_1$ to $P_{10}$) has a polarization that allows it to pass through surface 118 at $P_1$. After passing through plate 60 twice, the polarization of the second component of beam 22 (which is propagating from $P_{10}$ to $P_1$) is rotated 90 degrees compared to the polarization of the first component, which causes the second component of beam 22 to be reflected by surface 118 at $P_1$. After reflection at $P_1$, the second component of beam 22 is subsequently reflected by retroreflector 76 and a rear reflection surface 66 of mirror 100 by contacting points $P_2$, $P_3$, $P_4$, and $P_5$. After reflection by surface 66, the measurement beam (represented by reference numeral 26) passes point $P_4$ and exits interferometer 92 as a measurement beam component of an output beam 34.

The reference beam makes four passes through quarter-wave phase retardation plate 62. Plate 62 is oriented so that the plane of polarization of the reference beam is rotated by 90 degrees after a double pass through plate 62.

The first component of beam 28 (propagating from $P_1$ to a point $P_{13}$ on retroreflector 74) has a polarization that causes it to be reflected by surface 118 at $P_1$. After passing through plate 62 twice, the polarization of the second component of reference beam 28 (propagating from point $P_{13}$ toward $P_1$) is rotated 90 degrees relative to the polarization of the first component, which causes the second component of beam 28 to pass through surface 118 at point $P_1$. After passing through $P_1$, the second component of beam 28 is subsequently reflected by retroreflector 76 and a rear reflection surface 70 of mirror 108 by contacting points $P_2$, $P_3$, $P_6$, and $P_7$. After reflection by surface 70, measurement beam 32 is reflected by mirror 50 and surface 118 and exits interferometer 92 as a reference beam component of output beam 34.

An important property of interferometry system 90 is that the measurement and reference beam components of output beam 34 are coextensive (i.e., the measurement and reference beam components overlap and have no beam shear) independent of a lateral shear of either retroreflector 72 or retroreflector 74. This follows from the design of interferometry system 90 that causes the components of measurement beam 22 and the components of reference beam 28 to be coextensive beams, respectively, independent of a lateral shear of either retroreflector 72 or retroreflector 74.

Figure 3:
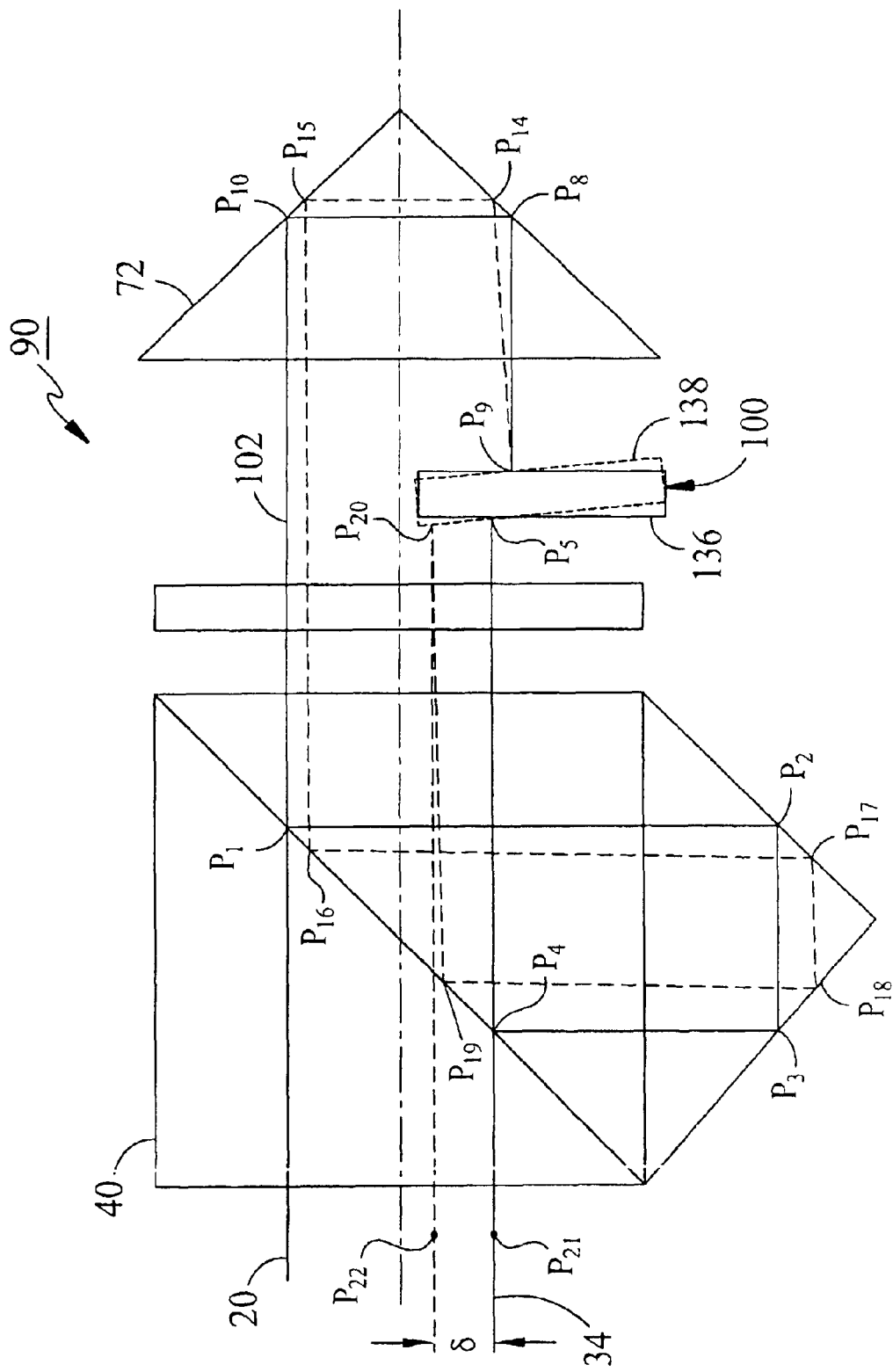

Another important property of interferometry system 90 is that the propagation directions of measurement and reference beam components of output beam 34 are independent of changes in orientation of mirrors 100 and 108. Referring to FIG. 3, when mirror 100 is at an aligned position 136 (i.e., the surface of mirror 100 is perpendicular to the measurement beam propagating toward the mirror), the path of the measurement beam after reflection by mirror 100 at $P_9$ will contact points P8, $P_{10}$, $P_1$, $P_2$, $P_3$, $P_4$, and $P_5$, then pass through a point $P_{21}$ to become part of the exit beam 34. This is shown in solid lines.

If mirror 100 is tilted to a misaligned position 138, the path of the measurement beam after reflection from mirror 100 at $P_9$ will contact points $P_{14}$, $P_{15}$, $P_{16}$, $P_{17}$, $P_{18}$, $P_{19}$, and $P_{20}$, then pass through a point $P_{22}$. This is shown in dashed lines. Although the path from $P_{20}$ to $P_{22}$ will be separated from the path from $P_5$ to $P_{21}$, by a distance δ, the two paths will be parallel. This means that even when mirror 100 is tilted, the measurement component of the exit beam will propagate in a direction that remains constant relative to the propagation direction of the reference component of the exit beam.

An important property of interferometry system 90 is that the relative shear of the reference and measurement beam components of output beam 34 is independent of the lateral displacements of either one or both of the retroreflectors 72 and 74 for a fixed orientation of mirror 100 and mirror 108. If the angle of incidence of beam 24 on reflection surface 64 of mirror 100 is not zero, or if the angle of incidence of beam 30 on reflection surface 68 of mirror 108 is not zero, a certain amount of relative shear will be induced between the reference and measurement components of output beam 34. The amount of the fixed relative shear will depend on the orientation of mirror 100 and mirror 108.

Although it is desirable to have zero relative shear between the reference and measurement beam components, this requires a critical alignment and the electrical interference signal amplitude produced from output beam 34 only increases in the second order as the zero relative shear condition is approached. In interferometry system 90, the relative shear of the reference and measurement beam components of exit beam 34 is fixed once the orientations of mirrors 100 and 108 are determined. The relative shear does not change when either one or both of the retroreflectors 72 and 74 makes a lateral movement. This reduces the generation of non-cyclic non-linear errors.

In operation, the orientation of mirrors 100 and 108 need only be aligned to an accuracy such that a partial overlap of the output measurement and reference beam components is achieved. When there is a partial overlap of the beam components, detector 40 will be able to generate an electrical interference signal from the overlapping beams.

Figure 4:
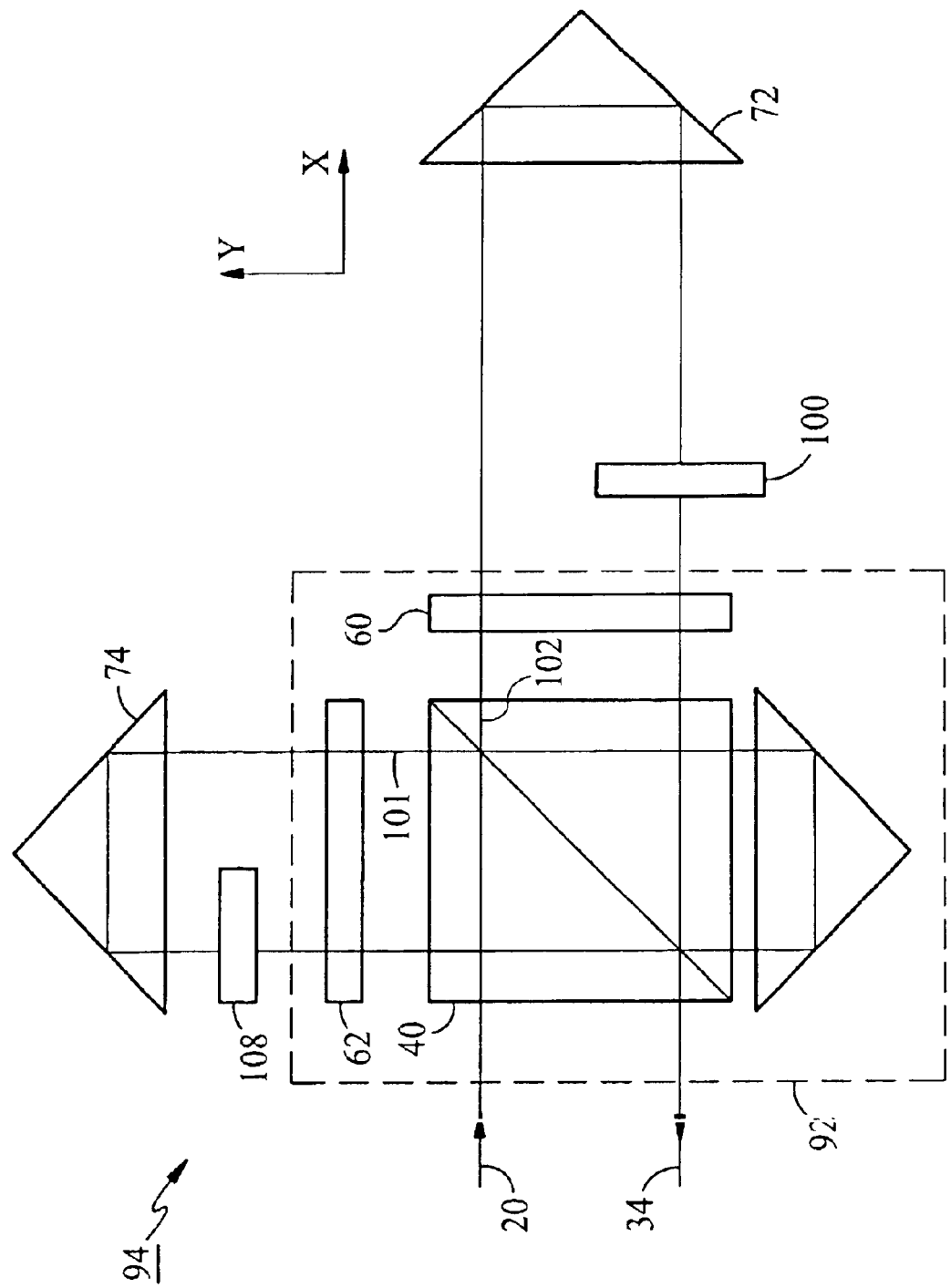

In the example of FIG. 2, fold mirror 50 is used to redirect the path of the reference beam toward retroreflector 74, which may be movable relative to interferometer 92. Referring to FIG. 4, in another example of an interferometry system 94, retroreflector 74 may be stationary relative to interferometer 92 and placed directly above interferometer 92 in the figure without the use of a fold mirror. Changes in interference of output beam 34 is indicative of changes in relative positions of retroreflector 72 and interferometer 92 along the X-direction.

Figure 4A:
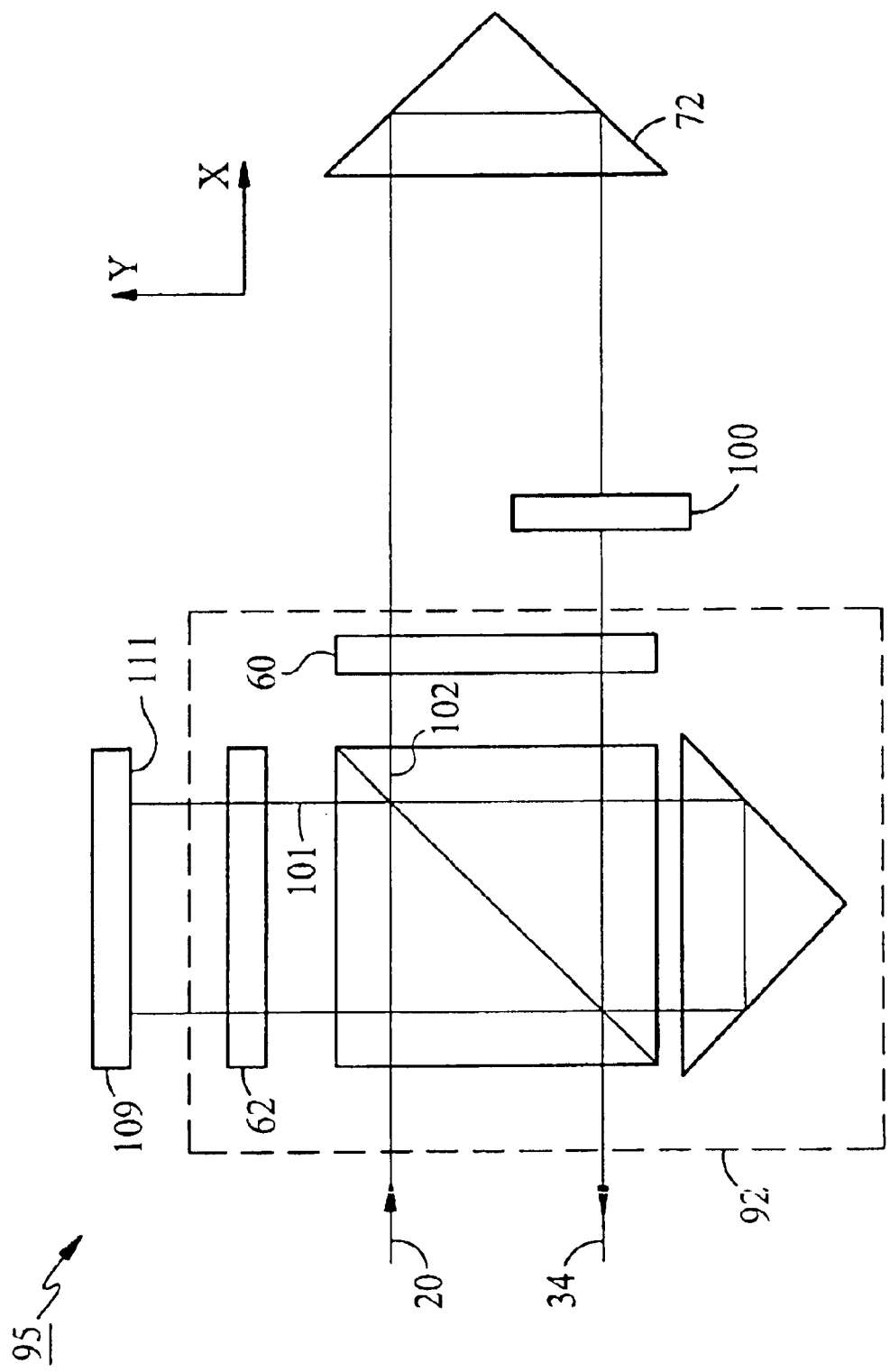

FIG. 4A shows another example of an interferometry system 95 that is similar to interferometry system 94 except that retroreflector 74 and mirror 108 are replaced by a mirror 109 having a reflection surface 111. Reflection surface 111 reflects reference beam 101 so that the reference beam makes two passes through interferometer 92 before combining with measurement beam 102 to form the output beam 34.

Figure 4B:
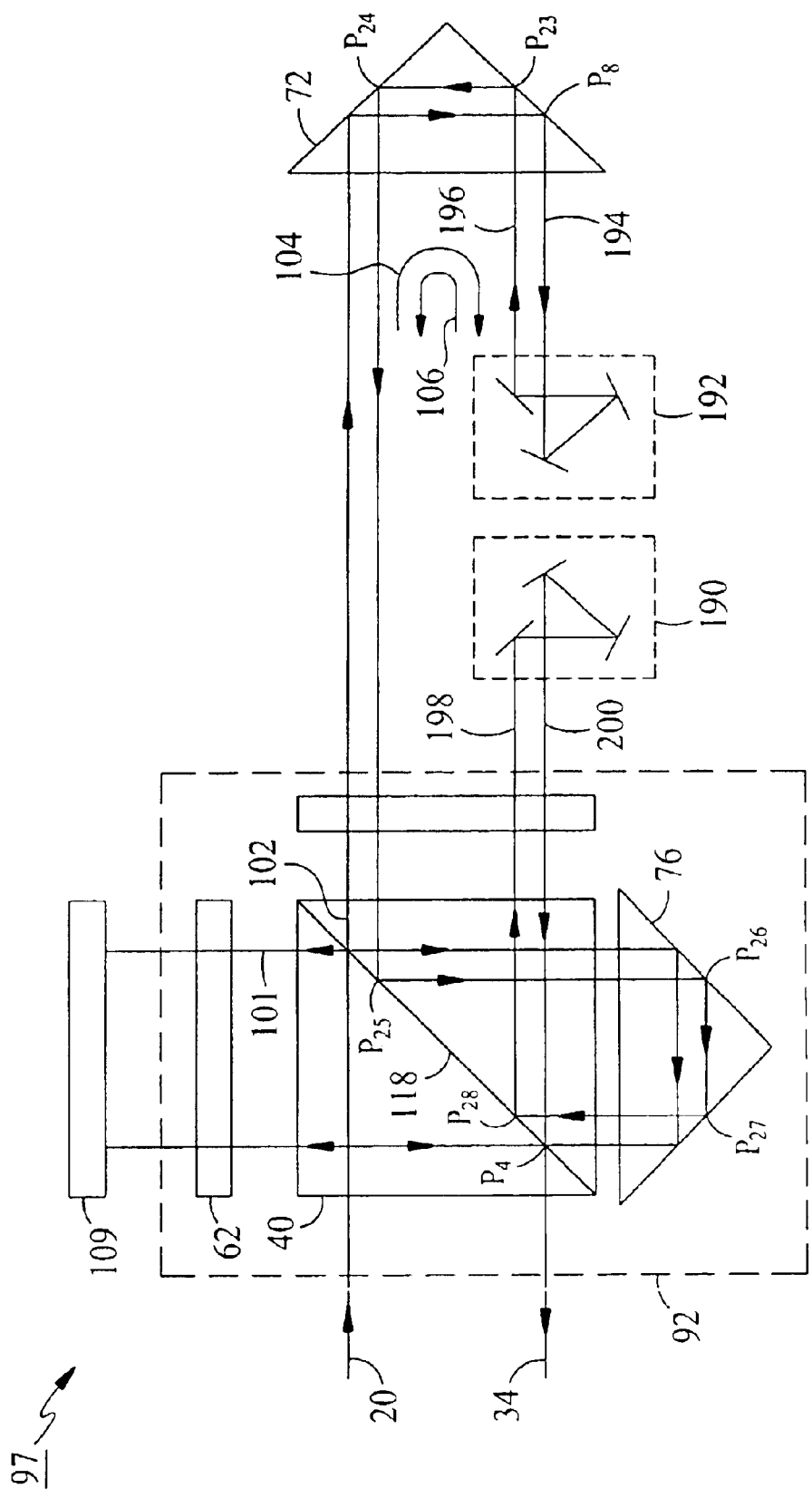

Referring to FIG. 4B, in another example of an interferometry system 97, a set of plane reflection surfaces 190 is used to redirect a portion of the measurement beam 194 that travels away from retroreflector 72 after the first pass 104 and before the second pass 106. The redirected measurement beam, represented by reference numeral 196, travels toward retroreflector 72 in a direction parallel to the portion of the measurement beam 194.

During the second pass, the measurement beam is reflected by retroreflector 72, beam splitting surface 118, and retroreflector 76 at points $P_{23}$, $P_{24}$, $P_{25}$, $P_{26}$, $P_{27}$, and $P_{28}$ in sequence. The measurement beam, represented by reference numeral 198, then travels toward a second set of plane reflection surfaces 192 that redirects the measurement beam toward interferometer 92. The portion of the measurement beam before and after being redirected by surfaces 192 are substantially parallel. The redirected measurement beam, represented by reference numeral 200, then travels toward $P_4$ and exits interferometer 92 to become the measurement component of the output beam 34.

The set of plane reflection surfaces 190 may include any odd number of reflection surfaces. Likewise, the set of plane reflection surfaces 192 may also include any odd number of reflection surfaces.

Figure 5:
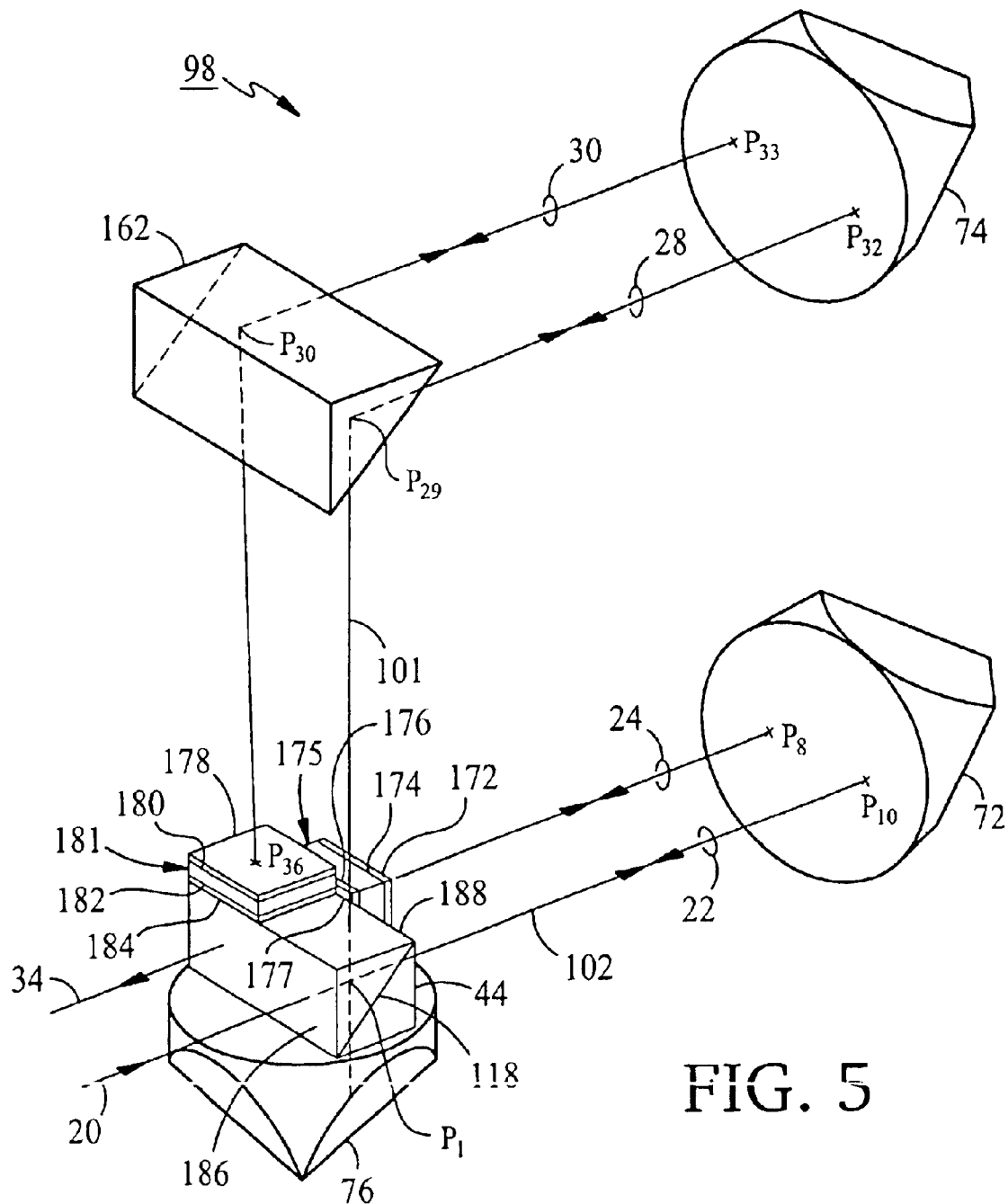

Referring to FIG. 5, in another example of an interferometry system 98, the portions of the measurement beam that contact retroreflector 72 and the portions of the reference beam that contact retroreflector 74 lie in different planes. An input beam 20 enters a right portion of a front side 186 of a PBS 44, which separates orthogonal components of input beam 20 at $P_1$ into a reference beam 101 and a measurement beam 102.

Measurement beam 102 makes two passes through retroreflector 72. During the first pass, beam 102 passes through a rear side 188 of PBS 44, travels toward retroreflector 72, contacts points $P_{10}$ and $P_8$ on retroreflector 72 in sequence, passes through a quarter wave phase retardation plate 172, and is reflected by a front reflection surface 174 of a mirror 175. Mirror 175 is sandwiched between plate 172 and another quarter wave phase retardation plate 177. Beams 22 and 24, which represent portions of the measurement beam, are horizontally spaced apart from each other.

During the second pass, after the measurement beam is reflected by reflection surface 174, beam 102 passes through plate 172 a second time (which causes the polarization direction of the measurement beam to rotate 90 degrees), contacts points $P_8$ and $P_{10}$ in sequence, and travels towards PBS 44. The measurement beam is reflected by the beam splitting surface 118 downwards toward retroreflector 76, which reflects the measurement beam to the left side of PBS 44. The measurement beam is reflected by surface 118, passes through quarter wave phase retardation plate 177, is reflected by is a rear reflection surface 176 of mirror 175, passes through plate 177 a second time, passes through surface 118, exits the front side 186 of PBS 118, and becomes the measurement component of exit beam 34.

Mirror 175 serves a function similar to mirror 100 of FIG. 2. Shear imparted to the measurement beam during the first pass (due to a lateral shift in retroreflector 72) is canceled by shear imparted to the measurement beam during the second pass. This is because reflection surface 174 reflects the measurement beam after the first pass and before the second pass so that during the second pass, the measurement beam retraces the path it traversed during the first pass. Therefore, even when there is a lateral shift in retroreflector 72, the measurement component of the exit beam will still be aligned with the reference component of exit beam 34 (assuming perfect alignment of retroreflector 74).

Reference beam 101, after reflection by surface 118 at $P_1$, makes two passes through retroreflector 74. During the first pass, the reference beam is directed vertically upwards toward a fold mirror 162. The reference beam is reflected by mirror 162 at point $P_{29}$ and becomes horizontally oriented. The reference beam is then reflected by retroreflector 74 at points $P_{32}$ and $P_{33}$, and travels toward a point $P_{30}$ on mirror 162. The reference beam is directed downward by mirror 162, passes through a quarter wave phase retardation plate 178, and is reflected by a front reflection surface 180 of a mirror 181. Mirror 181 is sandwiched between plate 178 and another quarter wave phase retardation plate 184. Beams 28 and 30, which represent portions of the reference beam that contact retroreflector 74, are horizontally spaced apart from each other. Beams 22 and 28 are vertically spaced apart from each other. Likewise, beams 24 and 30 are vertically spaced apart from each other.

During the second pass, after the reference beam is reflected by surface 180, the reference beam travels upwards and passes through plate 178 a second time, is reflected by mirror 162 and travels horizontally toward retroreflector 74. The reference beam is reflected by retroreflector 74, contacting points $P_{33}$ and $P_{32}$ in sequence, is reflected by mirror 162 and travels downwards toward PBS 44. The reference beam passes through surface 118, is reflected by retroreflector 76, then travels upwards and passes through plate 184. The reference beam is then reflected by a rear reflection surface 182 of mirror 181, passes through plate 184 a second time, travels downwards, is reflected by surface 118, then exits the front surface 186 of PBS 44 and becomes a reference component of exit beam 34.

Mirror 181 serves a function similar to mirror 108 of FIG. 2. Shear imparted to the reference beam during the first pass (due to a lateral shift in retroreflector 74) is canceled by shear imparted to the reference beam during the second pass. This is because reflection surface 180 reflects the reference beam after the first pass and before the second pass so that during the second pass, the reference beam retraces the path it traversed during the first pass. Therefore, even when there is a lateral shift in retroreflector 74, the reference component of the exit beam will still be aligned with the measurement component of exit beam 34 (assuming perfect alignment of retroreflector 72).

Figure 8:
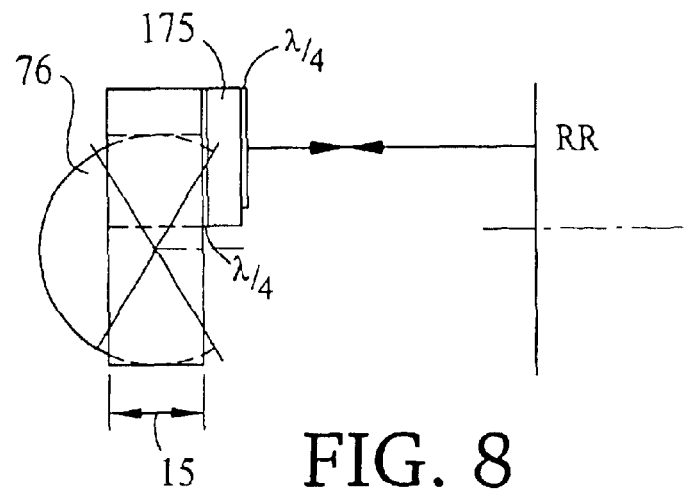
Figures 6, 7:
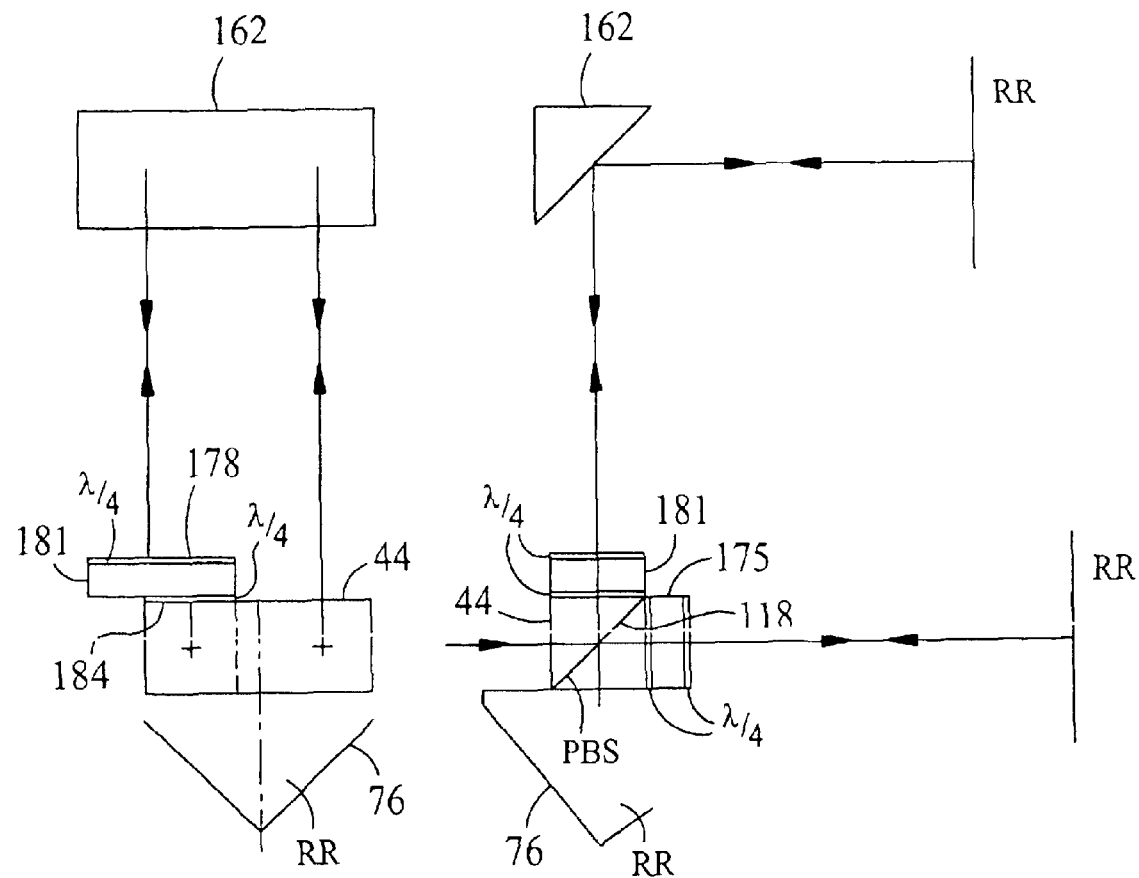

FIGS. 6, 7, and 8 show a front view, a side view, and a top view of interferometry system 98.

An advantage of interferometry system 98 is that the sizes of retroreflectors 72 and 74 may be larger than the size of PBS 44 when required to increase the usable clear aperture of the retroreflectors 72 and 74 relative to the clear apertures in PBS 44.

Figure 9:
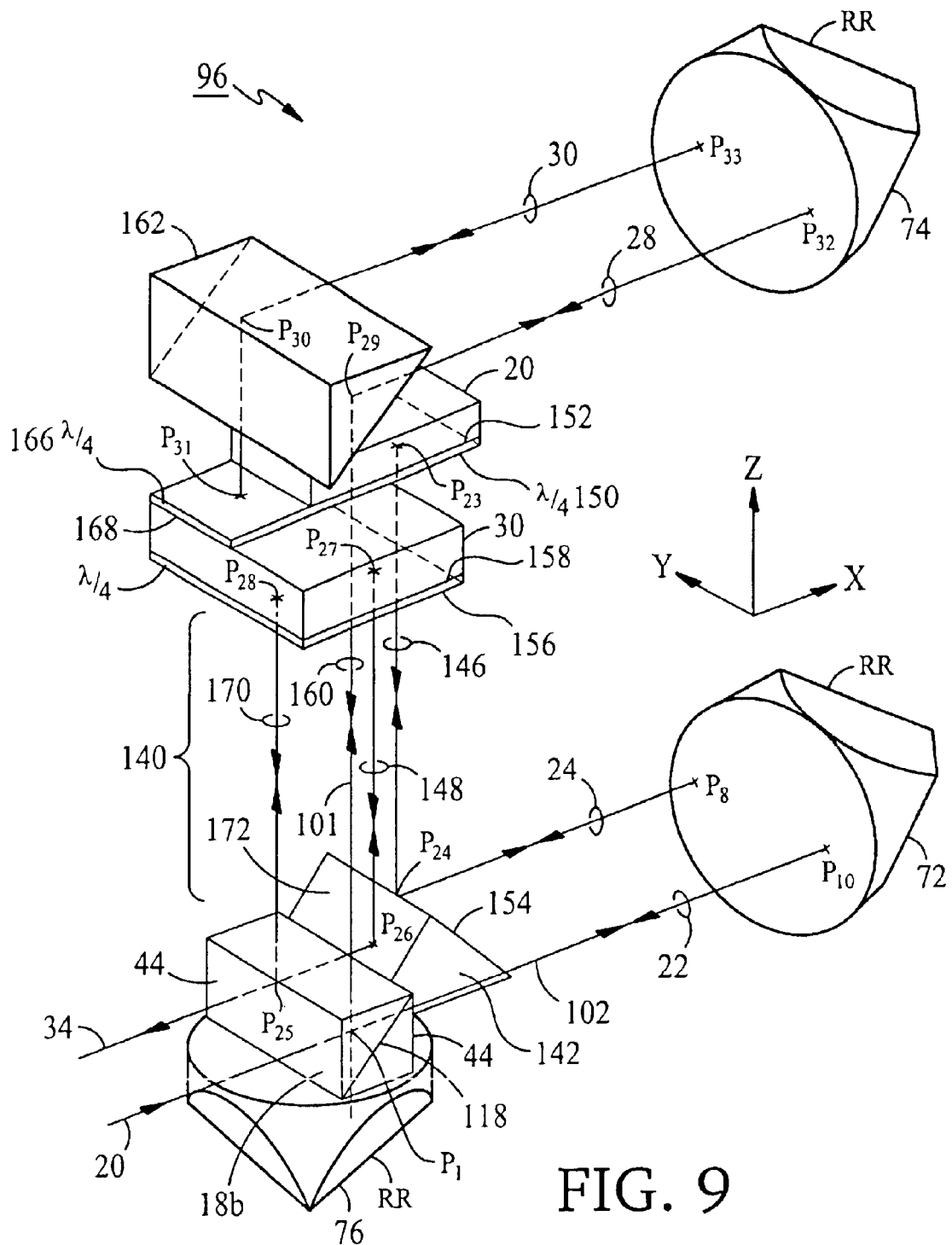

Referring to FIG. 9, a temperature compensated interferometry system 96 compensates for effects of changes in temperature in a vertical spatial separation region 140 between horizontally propagating portions of the reference and measurement beams. Temperature changes will change the refractive index of the medium (e.g., air or some other type of gas) in region 140 and the physical path length of region 140. If the optical path lengths of the measurement and reference beams change as a result of changes in environmental conditions, then the change will cause the interference of the reference and measurement beam components of output beam 34 to change even though the relative positions of retroreflectors 72 and 74 remain the same.

To accommodate changes in temperature and other factors that affect the optical path length, optical elements are used in interferometry system 96 to direct a portion of the measurement beam so that the reference and measurement beams both make double passes in the vertical direction. This causes the sum length of the portions of the measurement beam passing through region 140 to be the same as that of the reference beam. A right angle prism 142 having two reflecting surfaces 154 and 172 intercepts the measurement beam and directs the measurement beam upwards toward reflecting surfaces 152 and 158.

Similar to the example in FIG. 5, orthogonal components of input beam 20 are separated by surface 118 at $P_1$ into reference beam 101 and measurement beam 102. The measurement beam makes two passes through retroreflector 72. During the first pass, the measurement beam is reflected at point $P_{24}$ by surface 154 and travels upwards to form a beam 146. Beam 146 passes through a quarter wave phase retardation plate 150, and is reflected by reflection surface 152 of a mirror 20. During the second pass, beam 146 passes through plate 150 a second time, which causes the direction of the polarization of bean 146 to rotate 90 degrees. Beam 146 is then reflected by surface 154 and retroreflector 72 at points $P_{24}$, $P_8$, and $P_{10}$.

After reflection from retroreflector 72 during the second pass, the measurement beam is reflected by beam reflecting surface 118 and retroreflector 76 so that the measurement beam reaches a point $P_{26}$ on surface 172 of prism 142. The measurement beam is reflected by surface 172, and travels upwards to form beam 148. Beam 148 passes through quarter wave phase retardation plate 156, and is reflected by reflection surface 158. After reflection by surface 158, beam 148 travels downwards, passes through plate 156 a second time, is reflected at $P_{26}$ by surface 172, passes through surface 118 at point $P_{25}$, and exits PBS 44 as a measurement component of exit beam 34.

Reflecting surfaces 152 and 158 functions similarly to reflection surfaces 174 and 177 of FIG. 5, respectively. Reflection surface 152 causes the paths of the measurement beam during the first and second passes to overlap. This causes the two components of beam 22 (one propagating from $P_1$ to $P_{10}$, the other propagating from $P_{10}$ to $P_1$) to be coextensive independent of a lateral shift of (in a direction other than the X-direction) of retroreflector 72.

Reference beam 101 is reflected by surface 118 at $P_1$ and travels upwards to form beam 160 and makes two passes through retroreflector 74. During the first pass, the reference beam is reflected by fold mirror 162 and retroreflector 74, contacting points $P_{29}$, $P_{32}$, $P_{33}$, and $P_{30}$, passes through a quarter wave phase retardation plate 166, and is reflected at point $P_{31}$ by a reflection surface 168 of mirror 30. During the second pass, the reference beam passes through plate 166 a second time, and contacts $P_{30}$, $P_{33}$, $P_{32}$, $P_{29}$ and $P_1$ in sequence. After passing through $P_1$, the reference beam is reflected by retroreflector 76, passes through point $P_{25}$, and travels upwards to form beam 170. Beam 170 passes through plate 156, and is reflected by reflection surface 158. After reflection by surface 158, the reference beam passes through plate 156 a second time, is reflected at point $P_{25}$ by surface 118, and exits PBS 44 as a reference component of exit beam 34.

Reflection surfaces 168 and 158 function similarly to surfaces 180 and 182 of FIG. 5, respectively. Reflection surface 168 causes the paths of the reference beam during the first and second passes to overlap. This causes the two components of beam 28 (one propagating from $P_{29}$ to $P_{32}$, the other propagating from $P_{32}$ to $P_{29}$) to be coextensive independent of a lateral shift (in a direction other than the X-direction) of retroreflector 74.

Prism 142 causes a portion of the measurement beam to be directed upwards so that portions of the measurement beam (beams 146 and 148) pass through region 140. The sum of the path lengths of portions of the measurement beam passing through region 140 thus becomes substantially equal to the sum of the path lengths of portions of the reference beam passing through region 140. Therefore, a change in temperature of region 140 will affect the reference and measurement beams equally.

Reflecting surfaces 152, 158, and 168 are placed in close proximity to and attached to fold mirror 162. The spatial separation of reflecting surfaces 152, 158, and 168 is selected so that the path lengths of the portions of reference and measurement beams passing through region 140 are equal.

The interferometers shown in FIGS. 2, 4, 4A, 4B, 5, and 9 are Michelson interferometers. Other forms of interferometers, such as those described in an article entitled "Differential interferometer arrangements for distance and angle measurements: Principles, advantages and applications" by C. Zanoni, *VDI Berichte Nr.* 749, 93–106 (1989), the contents of which are incorporated herein by reference, may also be used. For example, the interferometer may be configured to measure multiple axes of metrology.

A polarization preserving retroreflector such as described in commonly owned U.S. Pat. No. 6,198,574 B1 entitled "Polarization Preserving Optical Systems" by Henry Allen Hill, the contents of which are incorporated herein by reference, may be beneficially used for retroreflector 76 to eliminate a cyclic error source present when using for example a corner cube retroreflector.

An advantage of the interferometry systems of FIGS. 2, 4, 4A, 4B, 5, and 9 is that there is no lateral shear of the measurement and reference beams relative to the interferometer when retroreflectors 72 and 74 make lateral translations. Therefore, the measurement and reference beams will pass through the interferometer at the intended paths even when retroreflector 72 and/or 74 are laterally translated.

Another advantage of the interferometry systems of FIGS. 2, 4, 4A, 4B, 5, and 9 is that there is no lateral shear of the output beam at a subsequent detector (e.g., 40) as either retroreflectors 72 and/or 74 are laterally translated. This advantage is particularly important when using a fiber optic for transport of the output beam to a remote detector.

The interferometry systems described above provide highly accurate measurements and are especially useful in lithography applications used in fabricating large scale integrated circuits, for example, computer chips. Lithography is a key technology driver for the semiconductor manufacturing industry. Overlay improvement is one of the five most difficult challenges down to and below 100 nm line widths (design rules), as mentioned in the *Semiconductor Industry Roadmap*, p 82 (1997).

Overlay depends directly on the performance, i.e., accuracy and precision, of the distance measuring interferometers used to position a wafer and reticle (or mask) stages. Since a lithography tool may produce $50–100 M/year of products, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 10:
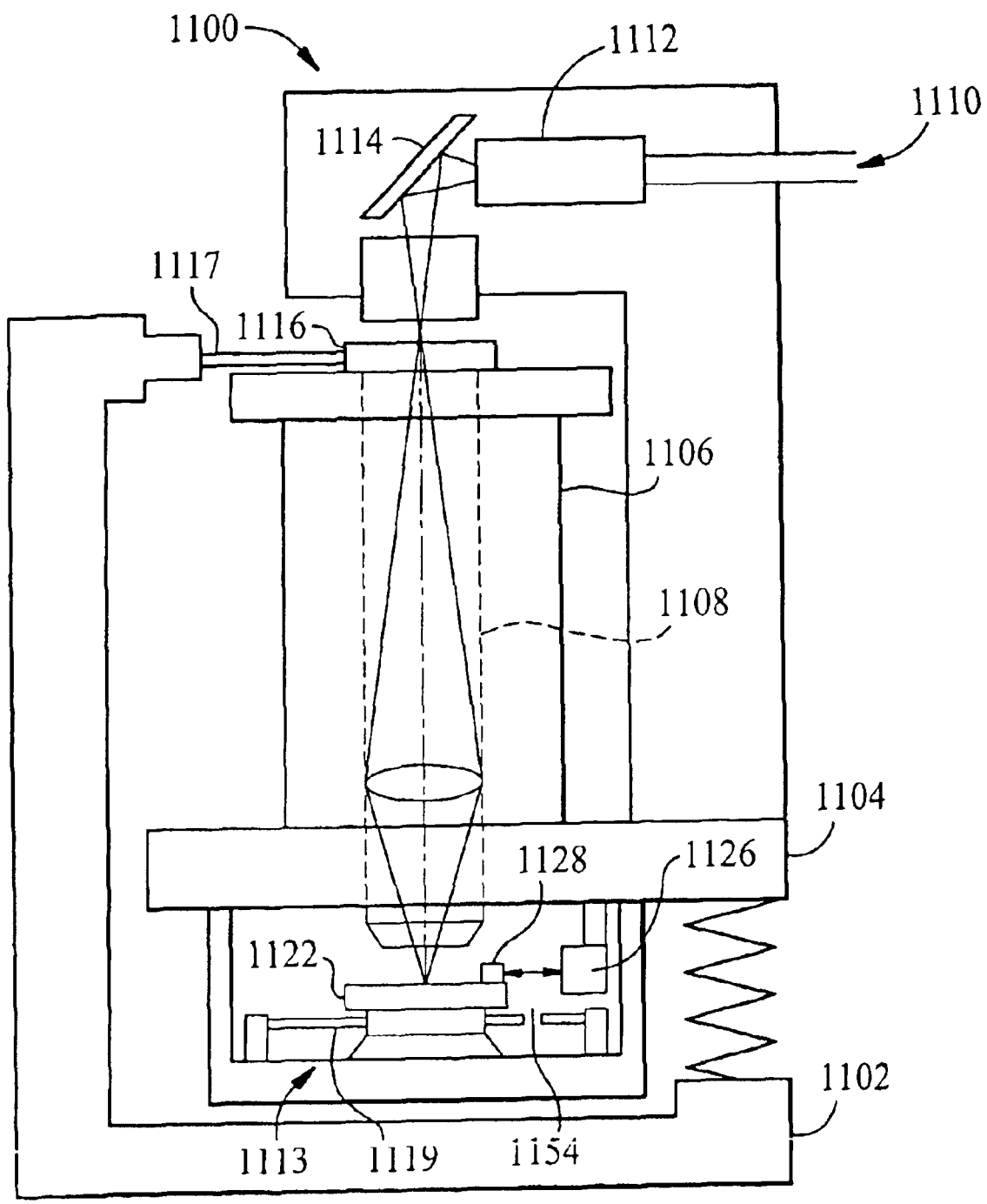
FIG. 10 shows a lithography system that includes an interferometry system and is used take integrated circuits.

An example of a lithography scanner 1100 using interferometry system 1126 is shown in FIG. 10. Interferometry system 1126 is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics.

In another example of a lithography scanner, one or more interferometry systems described above can also be used to precisely measure the position of mask stage 1116 as well as other moveable elements whose position must be accurately monitored in processes for fabricating lithographic structures.

Suspended below exposure base 1104 is a support base 1113 that carries wafer stage 1122. Stage 1122 includes a plane mirror 1128 for reflecting a measurement beam 1154 directed to stage 1122 by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to interferometry system 1126, which is mounted on exposure base 1104. Interferometry system 1126 may include any of the examples of interferometry systems described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other examples of the lithographic scanner, one or more of the interferometry systems described previously can be used to measure distances along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some examples, lithographic scanner 1100 can include what is known as a column reference. In such examples, interferometry system 1126 directs the reference beam (not shown) along an external reference path that contacts a reference mirror (not shown) mounted on some structure that directs the radiation beam, e.g., lens housing 1106. The reference mirror reflects the reference beam back to interferometry system 1126. An interference signal is produced by interferometry system 1126 by combining measurement beam 1154 reflected from stage 1122 and the reference beam reflected from a reference mirror mounted on the lens housing 1106. The interference signal indicates changes in the position of stage 1122 relative to the radiation beam. Furthermore, in other examples, interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 11:
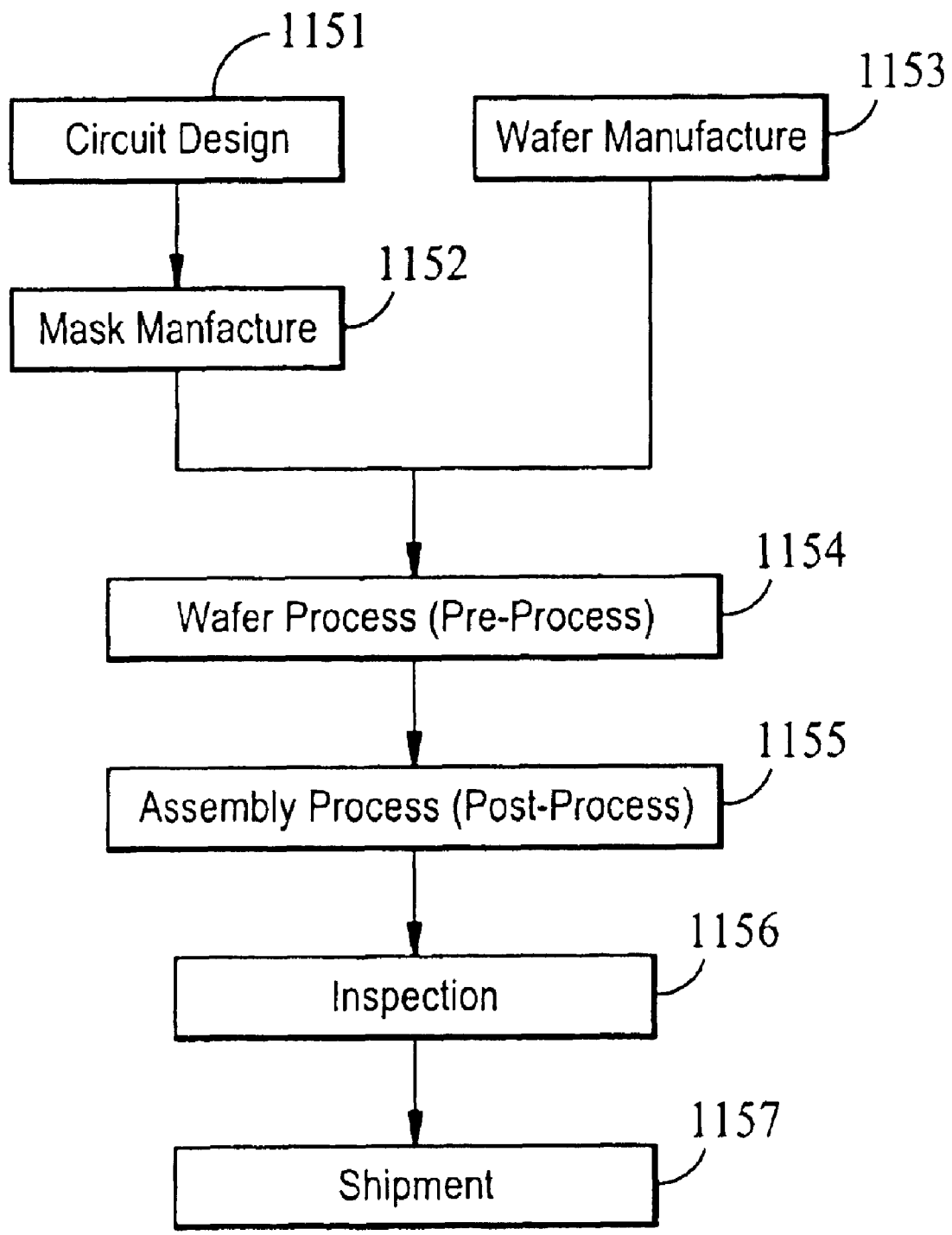
FIGS. 11 and 12 are flow charts that described steps for making integrated circuits.

Lithography is a critical part of manufacturing methods for making semiconductor devices. For example, U.S. Pat. No. 5,483,343 outlines steps for such manufacturing methods. These steps are described below with reference to FIGS. 11 and 12. FIG. 11 is a flow chart of the sequence of manufacturing a semiconductor device such as a semiconductor chip (e.g., IC or LSI), a liquid crystal panel, or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the prepared mask and wafer, circuits are formed on the wafer through lithography. To form circuits on the wafer that correspond with sufficient spatial resolution those patterns on the mask, interferometric positioning of the lithography tool relative to the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 12:
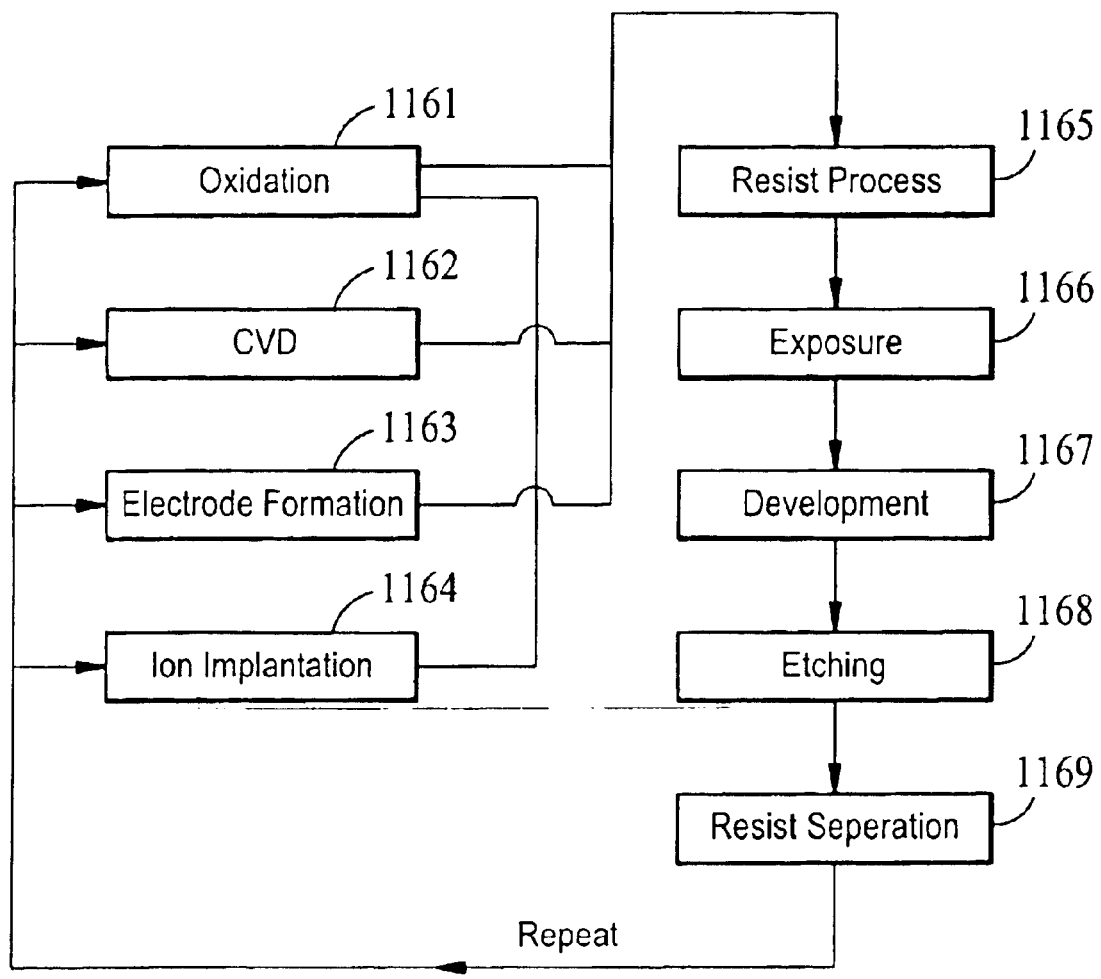

FIG. 12 is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 13:
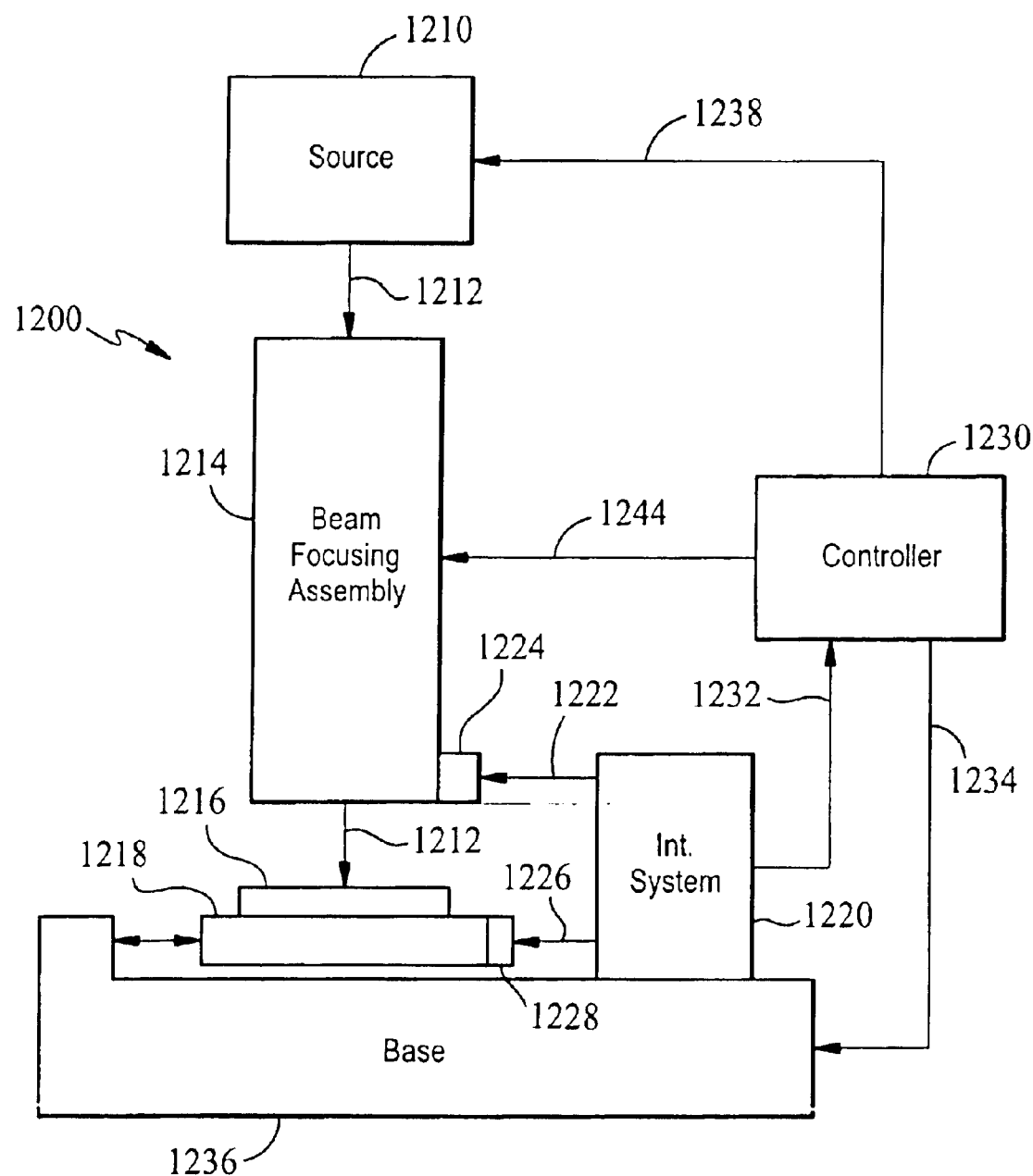
FIG. 13 shows a beam writing system that includes an interferometry system.

Referring to FIG. 13, an example of a beam writing system 1200 includes an interferometry system 1120 that uses a column reference. A source 1210 generates a write beam 1212. A beam focusing assembly 1214 directs the radiation beam to a substrate 1216 supported by a movable stage 1218. To determine the relative position of stage 1218, an interferometry system 1220 directs a reference beam 1222 to a mirror 1224 mounted on beam focusing assembly 1214 and a measurement beam 1226 to a mirror 1228 mounted on stage 1218.

Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts substrate 1216 with an intensity sufficient to cause photophysical or photochemical change only at selected positions of the substrate.

Furthermore, in some examples, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

Figure 14:
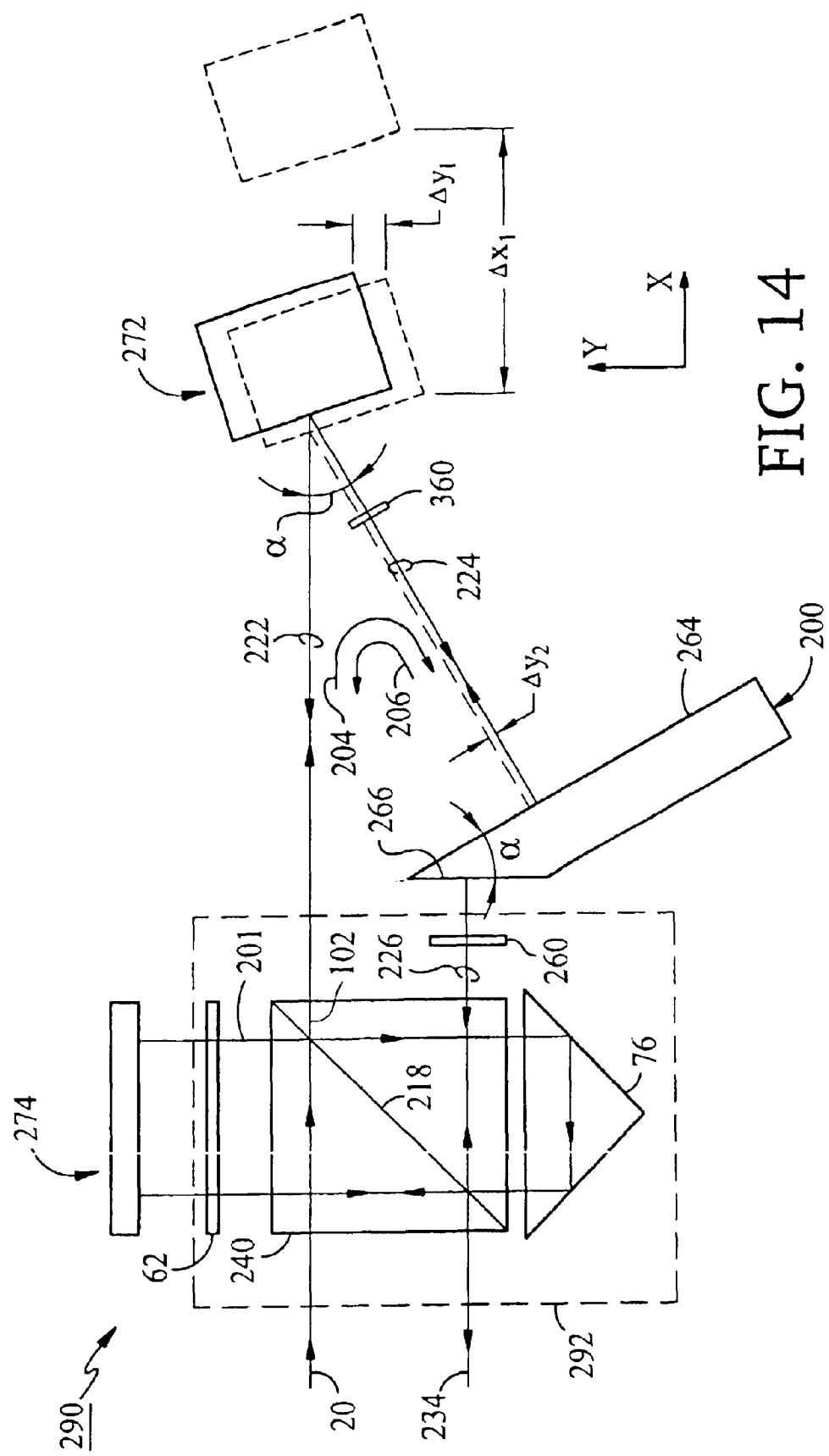
FIG. 14 shows an interferometry system.

Referring to FIG. 14, interferometry system 290 includes a double-pass interferometer 292, a constant deviation reflector 272, a truncated prism 200, a reference beam mirror 274, a polarizing beam splitter (PBS) 240, quarter-wave phase retardation plates 62, 260, and 360, and a retroreflector 76. PBS 240 includes a beam splitting surface 218 that separates orthogonal components of an input beam 20 into a reference beam 201 and a measurement beam 202. After making double passes through interferometer 292, reference beam 201 and measurement beam 202 are overlapped to form an output beam 234.

Measurement beam 202 makes a double pass (passes 204 and 206) through a constant deviation reflector 272. After the first pass 204 and before the second pass 206, the measurement beam is reflected by the reflecting surface 264 of truncated prism 200 such that during the second pass 206, the measurement beam retraces the path it traversed during the first pass 204 and propagates toward PBS 240. The paths of the measurement beam during the first and second passes overlap. By causing the paths of the measurement beam during the first and second passes to overlap, shear $\Delta y_2$ imparted to the measurement beam during the first pass due to a lateral shift $\Delta y_1$ and/or a longitudinal shift $\Delta x_1$ of constant deviation reflector 272 is automatically canceled during the second pass. As a consequence, the measurement beam is not sheared relative to the interferometer 292 as the beam passes through the interferometer. Also, the measurement beam is not sheared relative to the detector 40.

The elimination of beam shear in the interferometer and in the detector eliminates non-cyclic non-linear errors that would otherwise be generated by beam shear in the presence of wavefront errors. The elimination of the non-cyclic non-linear errors ensures an accurate measurement of changes in the optical path differences of the measurement and reference beam paths due to changes $\Delta x_1$ and $\Delta y_1$ in the relative positions of constant deviation reflector 272 and a reference reflector 274 despite lateral motions of constant deviation reflector 272.

The description of double pass interferometer 292 and reference beam mirror 274 is the same as corresponding portions of the description given for a high stability plane mirror interferometer (see cited reference by Zanoni). After the measurement beam completes the second pass 206, measurement beam 226 is incident on the reflecting surface 266 of truncated prism 200. When the angle between reflecting surfaces 264 and 266 is the same as the angle between beams 222 and 224, e.g. α as shown in FIG. 14, the directions of propagation of the reference and measurement beam components of output beam 234 are parallel independent of changes in orientation of truncated prism 200.

The length of reflecting surface 264 of truncated prism 200 is selected to accommodate the shear $\Delta y_2$ of measurement beam 224 on reflecting surface 264 as constant deviation reflector 272 is displaced in the x direction.

Figure 15A:
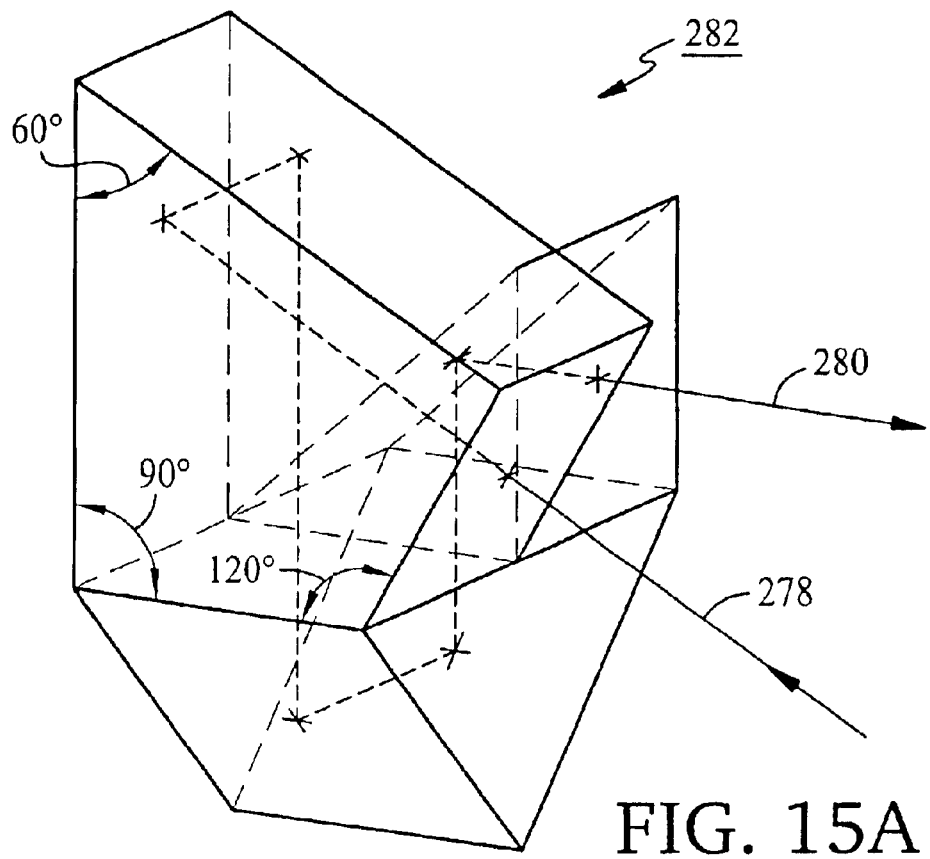
FIGS. 15A and 15B show constant deviation reflectors.
Figure 15B:
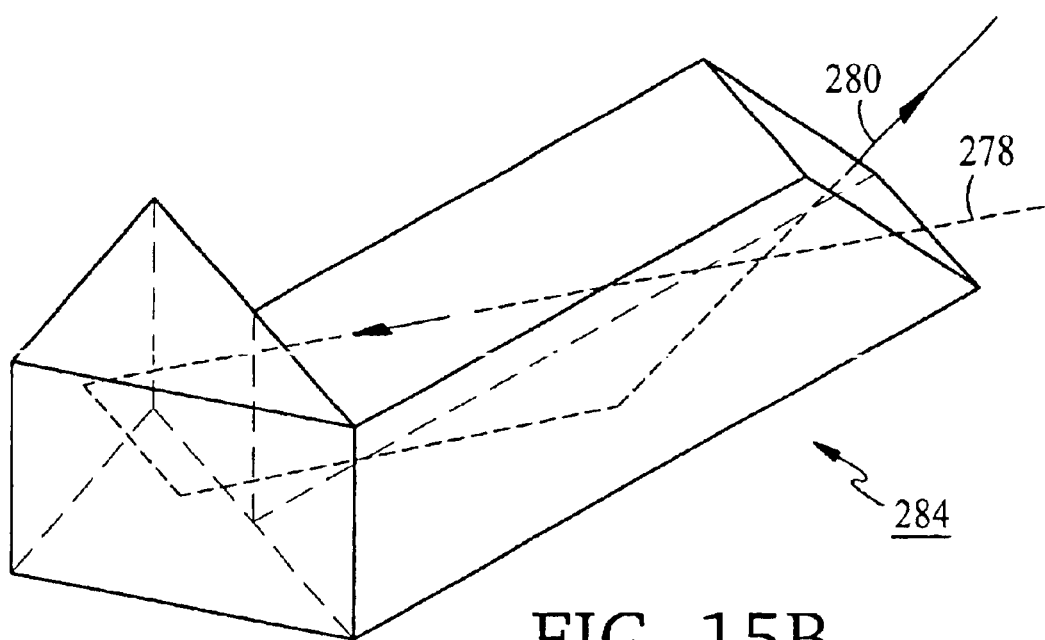

Referring to FIG. 15A, a constant deviation reflector 282 includes a Porro prism, a right angle prism, and a trapezium prism. The path of the measurement beam in constant deviation reflector 282 is shown in dashed lines. The angle θ between an input beam 278 and an output beam 280 of constant deviation reflector 282 is defined as:

$$\theta \equiv \sin^{-1}\left|\frac{k_1 \otimes k_2}{k_1 k_2}\right| \quad (1)$$

where $\otimes$ denotes the cross product of vectors $k_1$ and $k_2$, $k_1 = |k_1|$ and $k_2 = |k_2|$ are wave numbers for the input and output beams, respectively, and the directions of vectors $k_1$ and $k_2$ are the same as the direction of propagation of the input and output beams, respectively. FIG. 15B shows a similar constant deviation reflector 284 that includes a Porro prism, a right angle prism, and a trapesoid prism. The angle between input beam 278 and output beam 280 of constant deviation reflector 282 is also defined by equation (1).

The description of the constant deviation reflectors is the same as given in commonly owned U.S. Pat. No. 6,198,574 B1 entitled "Polarization Preserving Optical Systems" by Henry A. Hill, the contents of which are included herein in their entirety by reference. The constant deviation reflector shown herein in FIG. 15B for example is the same design as the constant deviation reflector shown in FIG. 5 of the above cited U.S. patent by Hill. In the examples shown in FIGS. 15A and 15B, the angle θ between the input beam 278 and output beam 280 is 30 degrees. The angles of incidence and refraction for the input and output beams, respectively, of the constant deviation reflectors shown in FIGS. 15A and 15B are zero.

The magnitude of angle θ is constant with respect to changes in orientation of constant deviation reflector 272 about a line parallel to $k_1 \otimes k_2$ and constant to first order to in changes in orientation about a line orthogonal to $k_1 \otimes k_2$ and parallel to $(k_1 \otimes k_2) \otimes (k_1 + k_2)$. The second order changes in angle θ affect corrections of a geometric type and the amplitude of the detected interference signal by detector 40. The limitation imposed by consideration of the interference signal amplitude is that the second order effect should be less than or of the order of 10 μrad corresponding to an angular change in orientation of constant deviation reflector 272 of less than or of the order of 10 mrad. The corrections for the effects of the second order changes will generally not be required for measurement accuracy levels down to of the order of 0.1 nm. However, if corrections for the effects of the second order changes are required in an end use application, the corrections are made according to procedures such as described in commonly owned U.S. Provisional Patent Application No. 60/378,004 that was filed on May 13, 2002 and entitled "Compensation For Geometric Effects Of Beam Misalignments In Plane Mirror Interferometers" by Henry A. Hill, the contents of which are incorporated herein in their entirety by reference.

The change in phase $\Phi(\Delta x_1, \Delta y_1)$ between the reference and measurement beams of the interference signal generated in detector 40 due to changes in position of constant deviation reflector 272 is given by the formula $$\Phi(\Delta x_1, \Delta y_1) = 4k_1 \cos\left(\frac{\alpha}{2}\right)\left\{[\cos\left(\frac{\alpha}{2}\right)]\Delta x_1 + [\sin\left(\frac{\alpha}{2}\right)]\Delta y_1\right\} \quad (2)$$

where it has been assumed that $k_1 = k_2$.

An advantage of interferometer system 290 is that the measurement axis for the interferometer system is orientated at an angle of $\alpha/2$ with respect to the direction of measurement beam 222 as evident from Equation (2).

Another advantage of interferometer system 290 is that there is no beam shear of beams in interferometer 292 and at detector 40 for displacements of constant deviation reflector 272 in either the x-, y-, or z-directions with the corresponding elimination of non-cyclic non-linear errors.

Figure 16:
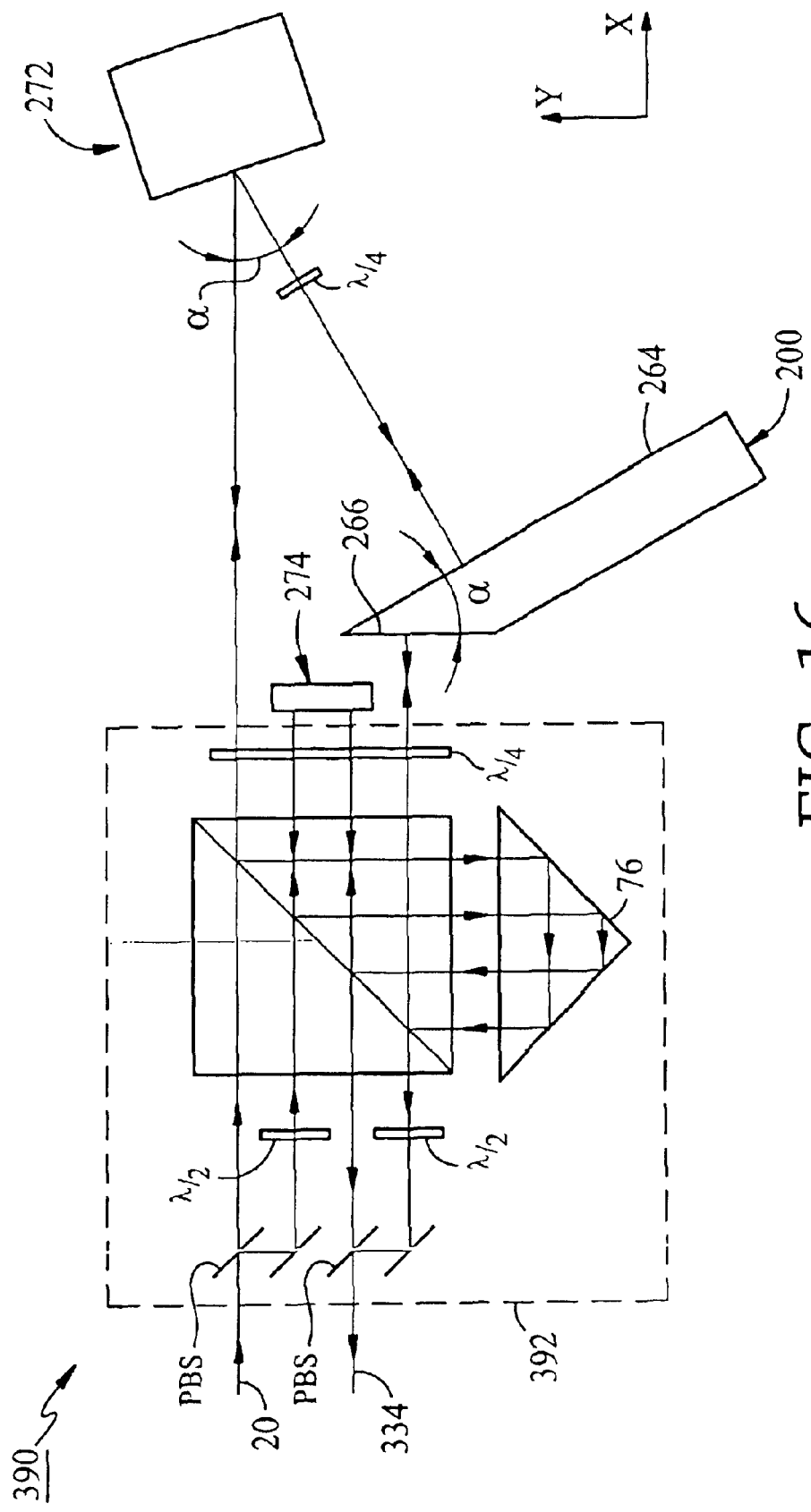
FIG. 16 shows an interferometry system.

Referring to FIG. 16, an interferometry system 390 includes a double pass interferometer 392, a constant deviation reflector 272, a truncated prism 200, and a reference mirror 274. The description of double pass interferometer 392 and reference beam mirror 274 is the same as corresponding portions of the description given for a differential plane mirror interferometer (see cited reference by Zanoni). The description of interferometer system is otherwise the same as the corresponding portions given for the description of interferometer 292 and reference beam mirror 274 (FIG. 14). Accordingly, there is no net shear of the measurement and reference beams in the interferometer, in overlapped beam 334 (the output beam), and in detector 40.

The elimination of beam shear in the interferometer and in the detector eliminates non-cyclic non-linear errors that would otherwise be generated by beam shear in the presence of wavefront errors. The elimination of the non-cyclic non-linear errors ensures an accurate measurement of changes in the optical path differences of the measurement and reference beam paths due to changes $\Delta x_1$ and $\Delta y_1$ in the relative position of constant deviation reflector 272 and a reference reflector 274 despite lateral motions of constant deviation reflector 272.

When interferometry system 390 is used, the change in phase $\Phi(\Delta x_1, \Delta y_1)$ between the reference and measurement beams of the interference signal generated in detector 40 due to changes in position of constant deviation reflector 272 is also given by the Equation (2) and the description of the properties of $\Phi(\Delta x_1, \Delta y_1)$ with respect to second order effects is the same as the corresponding portion of the description given for the interferometer system 290.

Although some implementations have been described above, other embodiments are also within the scope of the following claims.

For example, the sets of reflection surfaces 190 and 192 in FIG. 4B may be used in the examples given in FIGS. 2, 4, 4A, 5, and 9. The reference and measurement beams may pass through the interferometer in more than two passes. In FIG. 2, the mirror 100 having front and rear reflection surfaces 64 and 66 may be replaced by two one-sided mirrors that are linked so that when one mirror moves, the other mirror also moves so that the plane of one mirror is always parallel to a plane of the other mirror.

What is claimed is:

1. An apparatus comprising:
   an interferometer to split an input beam into a measurement beam and at least one other beam, to direct the measurement beam along a measurement path that includes at least two passes to a measurement object, to direct the other beam along a reference path that includes at least two passes to a reference object, and to overlap the measurement beam with the other beam after the measurement beam completes the at least two passes, in which the measurment object can be moved relative to the reference object to change a distance between the measurement and reference objects,
   the path of the measurement beam being sheared during the first and second passes when the measurement object moves; and
   one or more optics to redirect the measurement beam after the first pass and before the second pass so that the shear imparted during the second pass cancels the shear imparted during the first pass.

2. The apparatus of claim 1 in which the shear of the measurement beam path is caused by a movement of the measurement object along a direction orthogonal to a portion of the measurement path that is incident on the measurement object during the first pass.

3. The apparatus of claim 1 in which the one or more optics comprise a first reflection surface to redirect the measurement beam.

4. The apparatus of claim 3 in which the first reflection surface comprise a plane reflection surface.

5. The apparatus of claim 3 in which the one or more optics further comprise a second reflection surface to redirect the measurement beam after the second pass and before overlapping with the other beam.

6. The apparatus of claim 5 in which the first reflection surface remains parallel relative to the second reflection surface when the first and the second reflection surfaces move.

7. The apparatus of claim 1 in which the one or more optics comprise a mirror having a front reflection surface and a rear reflection surface, the front reflection surface to redirect the measurement beam after the first pass and before the second pass, the rear reflection surface to redirect the measurement beam after the second pass and before overlapping with the other beam.

8. The apparatus of claim 7 in which the front and rear reflection surfaces are parallel.

9. The apparatus of claim 5 in which the first reflection surface, the second reflection surface, and the interferometer are arranged so that after the measurement beam and the other beam overlaps, the measurement beam propagates in a direction parallel to the propagation direction of the other beam independent of movements of the first and second reflection surfaces relative to the interferometer.

10. The apparatus of claim 5 in which the first reflection surface, the second reflection surface, and the interferometer are arranged so that after the measurement beam and the other beam overlaps, the relative beam shear between the measurement beam and the other beam remains constant independent of a movement of the measurement object.

11. The apparatus of claim 1 in which the measurement object comprises a retroreflector.

12. The apparatus of claim 11 in which a first portion of the measurement beam propagating toward the retroreflector during the first pass contacts the retroreflector at a first location, a second portion of the measurement beam propagating away from the retroreflector during the first pass contacts the retroreflector at a second location, and the first and second locations are separated by a first distance.

13. The apparatus of claim 12 in which the measurement beam and the other beam overlaps to form an output beam that is separated from the input beam by a second distance.

14. The apparatus of claim 13 in which the second distance is smaller than the first distance.

15. The apparatus of claim 1 in which the reference object comprises a retroreflector or a plane reflection surface.

16. The apparatus of claim 1 in which the reference path is sheared during the first and second passes when the reference object moves.

17. The apparatus of claim 16 in which the shear in the reference path is caused by a movement of the reference object in a direction orthogonal to the direction of the path of a portion of the reference beam that is incident on the reference object during the first pass.

18. The apparatus of claim 16 further comprising one or more optics to redirect the other beam after the first pass and before the second pass so that the shear imparted during the second pass cancels the shear imparted during the first pass.

19. The apparatus of claim 18 in which the one or more optics that redirect the other beam after the first pass further redirect the other beam after the second pass and before overlapping with the measurement beam.

20. The apparatus of claim 1 in which the one or more optics further redirect the measurement beam after the second pass and before overlapping with the other beam so that the measurement beam propagates in a direction that remains constant relative to a propagation direction of the other beam independent of a change in the orientation of the one or more optics.

21. The apparatus of claim 1 in which the one or more optics further redirects the measurement beam after the second pass and before overlapping with the other beam so that a relative beam shear between the measurement beam and the other beam remains constant independent of a movement of the measurement object.

22. The apparatus of claim 1 in which the one or more optics comprise an odd number of reflection surfaces to receive a first portion of the measurement beam traveling away from the measurement object after the first pass and to redirect a second portion of the measurement beam toward the measurement object during the second pass such that the first and second portions of the measurement beam are substantially parallel.

23. The apparatus of claim 1 in which the measurement beam and the other beam have different frequencies.

24. The apparatus of claim 1 in which the measurement object comprises a constant deviation reflector.

25. The apparatus of claim 24 in which the one or more optics comprise a first reflection surface and a second reflection surface that is oriented at an angle relative to the first reflection surface.

26. The apparatus of claim 24 in which the one or more optics comprise a truncated prism.

27. The apparatus of claim 24 in which the one or more optics comprise a first reflection surface to redirect the measurement beam after the measurement beam travels the first pass but before the second pass.

28. The apparatus of claim 27 in which the one or more optics comprise a second reflection surface to redirect the measurement beam after the measurement beam completes the first and second passes but before overlapping with the other beam.

29. The apparatus of claim 28 in which the constant deviation reflector reflects an input beam into an output beam such that the paths of the input and output beams form a first angle that remains constant independent of a propagation direction of the input beam.

30. The apparatus of claim 29 in which the first and second reflection surfaces form a second angle that is equal to the first angle.

31. The apparatus of claim 24 in which the constant deviation reflector and the one or more optics are arranged so that after the measurement beam and the other beam overlaps, the measurement beam propagates in a direction parallel to the propagation direction of the other beam independent of a rotation of the one or more optics relative to the interferometer.

32. The apparatus of claim 24 in which the constant deviation reflector and the one or more optics are arranged so that after the measurement beam and the other beam overlaps, the relative beam shear between the measurement beam and the other beam remains constant independent of a movement of the constant deviation reflector.

33. The apparatus of claim 1 in which during the first pass, the measurement beam travels away from the interferometer and toward the measurement object, and is directed by the measurement object so that the measurement beam travels away from the measurement object and toward the one or more optics.

34. The apparatus of claim 1 in which during the second pass, the measurement beam travels away from the one or more optics and toward the measurement object, and is directed by the measurement object so that the measurement beam travels away from the measurement object and toward the interferometer.

35. The apparatus of claim 1 further comprising a detector that responds to optical interference between the overlapping beams and produces an interference signal indicative of an optical path length difference between the paths of the beams.

36. The apparatus of claim 35 in which the detector comprises a photodetector, an amplifier, and an analog-to-digital converter.

37. The apparatus of claim 35 further comprising an analyzer coupled to the detector to estimate a change in an optical path length difference of the beams based on the interference signal.

38. The apparatus of claim 1 further comprising a source to provide the beams.

39. The apparatus of claim 1 further comprising:
a stage to support a wafer for fabricating integrated circuits thereon;
an illumination system to image spatially patterned radiation onto the wafer; and
a positioning system to adjust the position of the stage relative to the imaged radiation, in which the interferometer is used to measure the position of the stage.

40. The apparatus of claim 1 further comprising:
a stage to support a wafer for fabricating integrated circuits thereon; and
an illumination system including a radiation source, a mask, a positioning system, and a lens assembly in which during operation the source directs radiation through the mask to produce spatially patterned radiation, the positioning system adjusts the position of the mask relative to wafer, the lens assembly images the spatially patterned radiation onto the wafer, and the interferometer is used to measure the position of the mask relative to the wafer.

41. The apparatus of claim 1 further comprising:
a source to provide a write beam to pattern a substrate,
a stage to support the substrate,
a beam directing assembly to deliver the write beam to the substrate, and
a positioning system to position the stage and beam directing assembly relative to one another, in which the interferometer and the one or more optics are used to measure the position of the stage relative to the beam directing assembly.

42. An apparatus comprising:
- an interferometer to split an input beam into a measurement beam and at least one other beam, to direct the measurement beam along a measurement path that includes at least two passes to a measurement object, to direct the other beam toward a reference object, and to overlap the measurement beam with the other beam after the measurement beam completes the at least two passes, in which the measurement object can be moved relative to the reference object to change a distance between the measurement and referance objects; and
- one or more optics to redirect the measurement beam after the first pass and before the second pass so that during the second pass, a portion of the measurement path traversed by the measurement beam propagating from the measurement object toward the interferometer remains the same independent of a movement of the measurement object,
- the one or more optics also to redirect the measurement beam after the second pass and before overlapping with the other beam.

43. The apparatus of claim 42 in which the one or more optics are designed so that during the second pass, the portion of the measurement path traversed by the measurement beam propagating from the measurement object toward the interferometer remains the same independent of a movement of the measurement object along a direction that is orthogonal to a portion of the measurement path that is incident on the measurement object during the first pass.

44. The apparatus of claim 42 in which the measurement object comprises a retroreflector.

45. The apparatus of claim 42 in which the one or more optics comprise a first reflection surface and a second reflection surface, the first reflection surface to redirect the measurement beam after the first pass and before the second pass, the second reflection surface to redirect the measurement beam after the second pass and before overlapping with the other beam.

46. The apparatus of claim 42 in which the one or more optics are arranged so that when the measurement beam overlaps with the other beam, the measurement beam propagates in a direction that remains constant relative to a propagation direction of the other beam independent of a change in the orientation of the one or more optics.

47. The apparatus of claim 45 in which the one or more optics comprise a mirror having a front reflection surface and a rear reflection surface.

48. The apparatus of claim 47 in which the front and rear reflection surfaces are parallel to each other.

49. The apparatus of claim 47 in which the measurement beam contacts each of the front and rear reflection surfaces of the mirror at least once before overlapping with the other beam.

50. The apparatus of claim 42 in which the interferometer directs the other beam along a reference path.

51. The apparatus of claim 50 in which the measurement path and the reference path define an optical path length difference, and changes in the optical path length difference are indicative of changes in the relative positions of the measurement and reference objects.

52. The apparatus of claim 42 in which the measurement object comprises a constant deviation reflector.

53. The apparatus of claim 42 in which the one or more optics comprise two reflection surfaces oriented at an angle relative to one another.

54. An apparatus comprising:
- an interferometer to split an input beam into a measurement beam and at least one other beam, to direct the measurement beam along a measurement path that includes at least two passes to a measurement object, and to overlap the measurement beam with the other beam after the measurement beam completes the at least two passes;
- a first optic to redirect the measurement beam after the first pass and before the second pass; and
- a second optic to redirect the measurement beam after the second pass and before the measurement beam combines with the other beam, the first and second optics are designed such that when the orientations of the first and second optics are determined, relative beam shear between the measurement beam and the other beam remains the same independent of a movement of the measurement object along a direction that is orthogonal to a portion of the measurement path that is incident on the measurement object during the first pass.

55. The apparatus of claim 54 in which the first optic comprises a reflection surface or an odd number of reflection surfaces.

56. The apparatus of claim 55 in which the second optic comprises a reflection surface or an odd number of reflection surfaces.

57. The apparatus of claim 54 in which the first and second optics move in a fixed relationship relative to one another.

58. The apparatus of claim 57 in which the measurement beam and the other beam propagate in the same directions independent of movements of the first and second optics.

59. An apparatus comprising:
- an interferometer to split an input beam into a measurement beam and at least one other beam, to direct the measurement beam along a measurement path that includes at least two passes to a cube corner retroreflector having reflection surfaces, and to overlap the measurement beam with the other beam after the measurement beam completes the at least two passes;
- an odd number of reflection surfaces to redirect the measurement beam traveling away from the retroreflector after the first pass and before the second pass so that during the second pass, the measurement beam travels toward a reflection surface of the retroreflector that was the last in sequence to be contacted by the measurement beam during the first pass, the odd number being larger than 1; and
- a reflection surface to redirect the measurement beam after the second pass and before overlapping with the other beam.

60. An apparatus comprising:
- an interferometer to split an input beam into at least a first beam and a second beam, to direct the first beam along a first path that reflects from a first object, to direct the second beam along a second path that reflects from a second object, and to overlap the first and second beams after being reflected by the first and second objects, respectively, and
- portions of the second beam traveling through a region in a direction non-parallel to the direction of the portion of the first beam that is incident on the first object; and
- one or more optics to direct portions of the first beam through the region such that a change in the environmental conditions of the region causes equal amounts of change in the optical path lengths of the first and second beams.

61. The apparatus of claim 60 in which the region comprises air or inert gas.

62. The apparatus of claim 60 in which the environmental conditions include temperature.

63. The apparatus of claim 60 in which the first object comprises a retroreflector.

64. The apparatus of claim 60 in which the first path includes at least two passes to the first object.

65. The apparatus of claim 64 in which the one or more optics include a first reflection surface that redirects the first beam after the first pass and before the second pass so that shear imparted to the first beam during the second pass cancels shear imparted to the first beam during the first pass.

66. The apparatus of claim 65 in which the shear is caused by a movement of the first object along a direction orthogonal to a portion of the first beam that is incident on the first object during the first pass.

67. The apparatus of claim 65 in which the one or more optics include a second reflection surface that directs the first beam from a direction parallel to the direction of the portion of the first beam that is incident on the first object to a direction that is parallel to the portions of the second path passing through the region.

68. The apparatus of claim 67 in which the one or more optics include a third reflection surface that redirects the first beam after the first beam completes the at least two passes and before overlapping with the second beam.

69. The apparatus of claim 68 in which the first reflection surface has an orientation that remains constant relative to an orientation of the third reflection surface.

70. The apparatus of claim 69 in which the first and third reflection surfaces are oriented so that when the first beam overlaps with the second beam, the first beam propagates in a direction that is constant relative to a propagation direction of the second beam independent of a change in the orientation of the first reflection and third reflection surfaces.

71. An apparatus comprising:
an interferometer to split an input beam into at least a first beam and a second beam, to direct the first beam along a first path that reflects from a first object, to direct the second beam along a second path that reflects from a second object, and to overlap the first and second beams after being reflected by the first and second objects, respectively, in which the first object can be moved relative to the second object to change a distance between the first and second objects,
the first path including two passes to the first object, the first path during the first pass including two portions that contact the first object, the two portions lying along a first plane, the second path including two passes to the second object, the second path during the first pass including two portions that contact the second object, the two portions lying along a second plane,
the first path being sheared during the first and second passes when the first object moves along a direction orthogonal to one of the two portions of the first path that contacts the first object; and
one or more optics to redirect the first beam after the first pass and before the second pass so that shear imparted during the second pass cancels shear imparted during the first pass.

72. The apparatus of claim 71 in which the first plane is parallel to the second plane and spaced apart from the second plane.

73. The apparatus of claim 71 in which the second path is sheared during the first and second passes when the second object moves along a direction orthogonal to a portion of the second path that contacts the second object.

74. The apparatus of claim 71 in which the interferometer comprises a beam splitter to split the input beam.

75. The apparatus of claim 74 in which the first object comprises retroreflector.

76. The apparatus of claim 75 in which a usable clear aperture of the retroreflector is larger than a clear aperture of the beam splitter.

77. A lithography system for use in fabricating integrated circuits on a wafer, comprising:
a stage to support the wafer;
an illumination system to image spatially patterned radiation onto the wafer;
a positioning system to adjust the position of the stage relative to the imaged radiation; and
the apparatus of claim 1 to measure the position of the stage along a first degree of freedom.

78. The lithography system of claim 77 further comprising a second one of the apparatus of claim 1 to measure the position of the stage along a second degree of freedom.

79. A lithography system for use in fabricating integrated circuits on a wafer, comprising:
a stage to support the wafer;
an illumination system including a radiation source, a mask, a positioning system, a lens assembly, and the apparatus of claim 1 in which during operation the source directs radiation through the mask to produce spatially patterned radiation, the positioning system adjusts the position of the mask relative to wafer, the lens assembly images the spatially patterned radiation onto the wafer, and the apparatus of claim 1 measures the position of the mask along a first degree of freedom relative to the wafer.

80. The lithography system of claim 79 further comprising a second one of the apparatus of claim 1 to measure the position of the mask along a second degree of freedom.

81. A lithography system for use in fabricating a lithography mask, comprising:
a source to provide a write beam to pattern the substrate,
a stage to support the substrate,
a beam directing assembly to deliver the write beam to the substrate;
a positioning system to position the stage and beam directing assembly relative to one another; and
the apparatus of claim 1 to measure the position of the stage along a first degree of freedom relative to the beam directing assembly.

82. The lithography system of claim 81 further comprising a second one of the apparatus of claim 1 to measure the position of the stage along a second degree of freedom.

83. An interferometry system for measuring changes in a position of a measurement object, comprising:
an interferometer to split an input beam into a measurement beam and at least a reference beam, to direct the measurement beam along a measurement path that includes at least two passes to the measurement object, to direct the reference beam to contact a reference object, and to overlap the measurement beam with the reference beam after the measurement beam completes the at least two passes, in which the measurement object can be moved relative to the reference object to change a distance between the measurement and reference objects,
the path of the measurement beam being sheared during the first and second passes when the measurement object moves along a first direction or laterally along a second direction that is orthogonal to the first direction; and
one or more optics to redirect the measurement beam after the first pass and before the second pass so that shear imparted during the second pass due to a movement of the measurement object cancels shear imparted during the first pass due to the movement, in which the one or more optics also redirects the measurement beam after the second pass and before overlapping with the reference beam.

84. The apparatus of claim 83 in which the measurement object comprises a constant deviation reflector.

85. The apparatus of claim 83 in which the one or more optics comprise a first reflection surface and a second reflection surface that is oriented at an angle relative to the first reflection surface.

86. A method comprising:
   directing a measurement beam along a measurement path through an interferometer, the measurement path including at least two passes to a measurement object, the path of the measurement beam being sheared during the first and second passes when the measurement object moves;
   directing at least one other beam along a reference path through the interferometer, the reference path including at least two passes to a reference object, in which the measurement object can be moved relative to the reference object to change a distance between the measurement and reference objects;
   redirecting the measurement beam after the first pass and before the second pass so that shear imparted during the second pass cancels shear imparted during the first pass; and
   overlapping the measurement beam with the other beam after the measurement beam completes the at least two passes.

87. The method of claim 86 in which the path of the measurement beam is sheared during the first and second passes when the measurement object moves along a direction orthogonal to a portion of the measurement path that is incident on the measurement object during the first pass.

88. The method of claim 86 further comprising redirecting the measurement beam after the measurement beam completes the at least two passes and before overlapping with the other beam so that when the measurement beam overlaps with the other beam, the measurement beam propagates in a direction that remains constant relative to a propagation direction of the other beam.

89. The method of claim 86 further comprising separating an input beam into the measurement beam and the at least one other beam.

90. The method of claim 86 in which the reference object comprises a retroreflector or a plane reflection surface.

91. The method of claim 86 in which the measurement object comprises a retroreflector or a constant deviation reflector.

92. The method of claim 86 further comprising determining an optical path length difference between the measurement and reference paths.

93. The method of claim 92 further comprising determining changes in the position of the measurement object relative to the reference object based on changes in the optical path length difference.

94. The method of claim 86 in which the measurement beam and the other beam have different frequencies.

95. The method of claim 86 further comprising detecting an interference signal from the overlapping beams.

96. The method of claim 95 further comprising determining changes in the position of the measurement object based on the interference signal.

97. The method of claim 86 further comprising:
   supporting a wafer on a stage;
   imaging spatially patterned radiation onto the wafer;
   adjusting the position of the stage relative to the imaged radiation; and
   measuring the relative position of the stage using the overlapping beams.

98. The method of claim 86 further comprising:
   supporting a wafer on a stage;
   directing radiation from a source through a mask to produce spatially patterned radiation;
   positioning the mask relative to the wafer;
   measuring the position of the mask relative to the wafer using the overlapping beams; and
   imaging the spatially patterned radiation onto the wafer.

99. The method of claim 86 further comprising:
   providing a write beam to pattern a substrate;
   supporting the substrate on a stage;
   delivering the write beam to the substrate;
   positioning the stage relative to the write beam; and
   measuring the relative position of the stage using the overlapping beams.

100. A method comprising:
   directing a measurement beam along a measurement path through an interferometer, the measurement path including at least two passes to a measurement object;
   directing at least one other beam along a reference path through the interferometer, reference path including at least two passes to a reference object, in which the measurement object can be moved relative to the reference object to change a distance between the measurement and reference objects;
   redirecting the measurement beam after the first pass and before the second pass so that during the second pass, a portion of the measurement path traversed by the measurement beam propagating from the measurement object toward the interferometer remains the same independent of a movement of the measurement object;
   redirecting the measurement beam a second time after the measurement beam completes the at least two passes; and
   overlapping the measurement beam and the other beam after redirecting the measurement beam the second time.

101. The method of claim 100 in which the measurement beam is redirected so that during the second pass, a portion of the measurement path traversed by the measurement beam propagating from the measurement object toward the interferometer remains the same independent of a movement of the measurement object along a direction that is orthogonal to a portion of the measurement path that is incident on the measurement object.

102. The method of claim 100 in which when the measurement beam overlaps with the other beam, the measurement beam propagates in a direction that remains constant relative to a propagation direction of the other beam.

103. The method of claim 100 in which the measurement object comprises a retroreflector or a constant deviation reflector.

104. A method comprising:
   directing a measurement beam along a measurement path through an interferometer, the measurement path including at least two passes to a measurement object;
   directing at least one other beam through the interferometer to contact a reference object, in which the measurement object can be moved relative to the reference object to change a distance between the measurement and reference objects;
   redirecting the measurement beam after the first pass and before the second pass so that relative beam shear between the measurement path and the other path remains the same independent of a movement of the measurement object; and redirecting the measurement beam a second time after the measurement beam completes the at least two passes; and overlapping the measurement beam and the other beam after the measurement beam completes the at least two passes.

105. The method of claim 104 in which redirecting the measurement beam after the first pass and before the second pass comprises redirecting the measurement beam so that relative beam shear between the measurement path and the other path remains the same independent of a movement of the measurement object along a direction that is orthogonal to a portion of the measurement path that is incident on the measurement object.

106. The method of claim 104 further comprising redirecting the measurement beam after the measurement beam completes the at least two passes and before overlapping with the other beam so that when the measurement beam overlaps with the other beam, the measurement beam propagates in a direction that remains constant relative to a propagation direction of the other beam.

107. The method of claim 104 in which the measurement object comprises a retroreflector or a constant deviation reflector.

108. A method comprising:
separating an input beam into a measurement beam and at least one other beam;
directing the measurement beam along a measurement path that includes at least two passes to a cube corner retroreflector having reflection surfaces;
directing the other beam to contact a reference object, in which the retroreflector can be moved relative to the reference object to change a distance between the retroreflector and the reference object;
redirecting the measurement beam traveling away from the retroreflector after the first pass and before the second pass so that during the second pass, the measurement beam travels toward a reflection surface of the retroreflector that was the last in sequence to be contacted by the measurement beam during the first pass;
redirecting the measurement beam a second time after the measurement beam completes the at least two passes; and
overlapping the measurement beam with the other beam after redirecting the measurement beam the second time.

109. A method comprising:
directing a first beam along a first path through an interferometer, the first path contacting a first object;
directing a second beam along a second path through the interferometer, the second path contacting a second object, portions of the second path traveling through a region in a direction non-parallel to the direction of the portion of the first beam contacting the first object;
directing portions of the first beam through the region such that a change in the environmental conditions of the region causes equal amounts of change in the optical path lengths of the first and second beams; and
overlapping the first and second beams after being reflected by the first and second objects, respectively.

110. The method of claim 109 in which the environmental conditions include temperature.

111. The method of claim 109 in which the first path includes at least two passes to the first object.

112. The method of claim 111 further comprising redirecting the first beam after the first pass and before the second pass so that shear imparted to the first beam during the first pass is canceled by shear imparted to the first beam during the second pass.

113. The method of claim 112 in which the shear is caused by a shift in the position of the first object in a direction orthogonal to the direction of a portion of the first beam contacting the first object.

114. The method of claim 113 further comprising directing the first beam from a direction parallel to the direction of the portion of the first beam contacting the first object to a direction that is parallel to the portions of the second path passing through the region.

115. The method of claim 111 further comprising redirecting the first beam after the first beam completes the at least two passes and before overlapping with the second beam so that when the first beam overlaps with the second beam, the first beam propagates in a direction that is constant relative to a propagation direction of the second beam.

116. The method of claim 111 further comprising redirecting the first beam after the first pass and before the second pass so that when the first and second beams overlap, a relative shear between the first and second beams remains constant independent of a movement of the first object in a direction orthogonal to the direction of a portion of the first beam that is incident on the first object.

117. A lithography method for fabricating integrated circuits on a wafer, comprising:
supporting the wafer on a stage;
imaging spatially patterned radiation onto the wafer;
adjusting the position of the stage relative to the imaged radiation; and
measuring the relative position of the stage along a first degree of freedom using the method of claim 86.

118. The lithography method of claim 117 further comprising using the method of claim 86 to measure the relative position of the stage along a second degree of freedom.

119. A lithography method for fabricating integrated circuits on a wafer, comprising:
supporting the wafer on a stage;
directing radiation from a source through a mask to produce spatially patterned radiation;
positioning the mask relative to the wafer;
measuring the position of the mask along a first degree of freedom relative to the wafer using the method of claim 86; and
imaging the spatially patterned radiation onto the wafer.

120. The lithography method of claim 119 further comprising using the method of claim 86 to measure the relative position of the mask along a second degree of freedom.

121. A beam writing method comprising:
providing a write beam to pattern a substrate;
supporting the substrate on a stage;
delivering the write beam to the substrate;
positioning the stage relative to the write beam; and
measuring the relative position of the stage along a first degree of freedom using the method of claim 86.

122. The beam writing method of claim 121 further comprising using the method of claim 86 to measure the relative position of the stage along a second degree of freedom.

* * * * *